(12) United States Patent
Nakamura et al.

(10) Patent No.: US 11,152,465 B2
(45) Date of Patent: Oct. 19, 2021

(54) SEMICONDUCTOR DEVICE COMPRISING SURFACE SEMICONDUCTOR REGION FOR INCREASED BREAKDOWN STRENGTH

(71) Applicant: SHINDENGEN ELECTRIC MANUFACTURING CO., LTD., Tokyo (JP)

(72) Inventors: Hideyuki Nakamura, Saitama (JP); Yoshifumi Matsuzaki, Saitama (JP); Hirokazu Ito, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 193 days.

(21) Appl. No.: 16/498,598

(22) PCT Filed: Aug. 31, 2017

(86) PCT No.: PCT/JP2017/031350
§ 371 (c)(1),
(2) Date: Sep. 27, 2019

(87) PCT Pub. No.: WO2019/043867
PCT Pub. Date: Mar. 7, 2019

(65) Prior Publication Data
US 2020/0052069 A1  Feb. 13, 2020

(51) Int. Cl.
*H01L 29/06* (2006.01)
*H01L 29/40* (2006.01)

(52) U.S. Cl.
CPC ...... *H01L 29/0692* (2013.01); *H01L 29/0623* (2013.01); *H01L 29/402* (2013.01)

(58) Field of Classification Search
None
See application file for complete search history.

(56) References Cited

U.S. PATENT DOCUMENTS

2006/0273346 A1* 12/2006 Pfirsch ............... H01L 29/0692
257/171
2007/0246791 A1* 10/2007 Schulze ............. H01L 29/0615
257/495

(Continued)

FOREIGN PATENT DOCUMENTS

JP   H6-244405 A    9/1994
JP   H10-173174 A   6/1998

(Continued)

OTHER PUBLICATIONS

International Search Report in PCT/JP2017/031350, dated Nov. 21, 2017, 4pp.

(Continued)

*Primary Examiner* — Daniel Whalen
(74) *Attorney, Agent, or Firm* — Hauptman Ham, LLP

(57) ABSTRACT

A semiconductor device includes an n-type base substrate; a p-type first region; a p-type surface region having a plurality of second corner portions and a plurality of second side portions surrounding the first region. The p-type surface region has a dopant concentration lower than a dopant concentration of the first region. The semiconductor device further includes a field plate in a region overlapping with the surface region in a plan view by way of an insulation film. The field plate has a plurality of field plate corner portions and a plurality of field plate side portions. A relationship of L1>L2 is established at least at a portion of the surface region or a relationship of FP1>FP2 is established at least at a portion of the field plate is satisfied. A withstand voltage of the second side portion is lower than a withstand voltage of the second corner portion.

12 Claims, 21 Drawing Sheets

(56) References Cited

U.S. PATENT DOCUMENTS

2012/0299164 A1 11/2012 Nishimura et al.
2015/0102452 A1* 4/2015 Kamibaba ........... H01L 29/0661
257/488

FOREIGN PATENT DOCUMENTS

| JP | 3872827 B2 | 1/2007 |
|---|---|---|
| JP | 2009-164486 A | 7/2009 |
| JP | 2014-203959 A | 10/2014 |

OTHER PUBLICATIONS

Search report in NL application No. 2021436, dated Mar. 21, 2019, 13pp.

* cited by examiner

SEMICONDUCTOR DEVICE COMPRISING SURFACE SEMICONDUCTOR REGION FOR INCREASED BREAKDOWN STRENGTH

RELATED APPLICATIONS

The present application is a National Phase of International Application Number PCT/JP2017/031350, filed Aug. 31, 2017.

TECHNICAL FIELD

The present invention relates to a semiconductor device.

BACKGROUND ART

Conventionally, there has been known a semiconductor device where guard rings are formed in a peripheral region (a semiconductor device having a guard ring structure) (see patent document 1, for example).

A semiconductor device 900 shown in FIG. 27A and FIG. 27B exemplifies such a conventional semiconductor device.

The conventional semiconductor device 900 is a so-called semiconductor chip.

As shown in FIG. 27A and FIG. 27B, the semiconductor device 900 includes: an n-type semiconductor base substrate 910; a p-type first semiconductor region 920 formed on a surface of a first main surface of the semiconductor base substrate 910; a plurality of guard rings 930 formed on the surface of the first main surface so as to surround the first semiconductor region 920 as viewed in a plan view; an insulation film 940 formed on the surface of the first main surface in a range from a region where the first semiconductor region 920 is formed to a region outside the guard rings 930 as viewed in a plan view; a first semiconductor region side electrode 952 formed in a region overlapping with the first semiconductor region 920 as viewed in a plan view; and a field plate 954 formed in a range from a region overlapping with the first semiconductor region side electrode 952 to a region overlapping with the guard ring 930 with the insulation film 940 interposed between the first semiconductor region side electrode 952 and the guard ring 930 as viewed in a plan view. The first semiconductor region side electrode 952 and the field plate 954 form a first electrode 950.

The semiconductor device 900 also includes, besides the above-mentioned constitutional elements, a second electrode 960, a channel stopper electrode 970, a protective insulation layer 980, and a channel stopper 990.

In the conventional semiconductor device 900, the guard rings 930 are formed in the peripheral region and hence, a depletion layer which extends from a PN junction formed between the first semiconductor region 920 and the semiconductor base substrate 910 when a reverse bias is applied can be extended to the peripheral region and, at the same time, a curvature of the depletion layer can be made small. As a result, a withstand voltage of the semiconductor device 900 can be increased.

PRIOR ART DOCUMENT

Patent Document

Patent document 1: JP-A-10-173174

SUMMARY OF INVENTION

Problem to be Solved by the Invention

However, in a semiconductor device having a guard ring structure such as the conventional semiconductor device 900, it is necessary to increase the number of guard rings 930 to acquire a certain high withstand voltage. Accordingly, in such a semiconductor device having the guard ring structure, by increasing the number of guard rings, an area of the peripheral region is increased thus giving rise to a drawback that the miniaturization of the semiconductor device is difficult.

Further, in the conventional semiconductor device 900, when a reverse bias is applied, there is a case where a withstand voltage at a corner portion of the guard ring 930 becomes smaller than a withstand voltage at a side portion of the guard ring 930. For example, in the conventional semiconductor device 900, at a predetermined point of the corner portion (particularly, the point disposed at a location remotest from boundaries between the corner portion and two side portions sandwiching the corner portion in a case where a curvature of the corner portion is a fixed value, or the point disposed at a location of 45° in a case where the corner portion is formed in an arc shape having a center angle of 90° as viewed in a plan view as in the case of the conventional semiconductor device 900), a depletion layer extends least in view of a charge balance. Accordingly, an avalanche breakdown is generated first at the corner portion, particularly at an area in the vicinity of the above-mentioned predetermined point of the corner portion and a current density of the corner portion is increased thus also giving rise to a drawback that a breakdown strength of the whole semiconductor device is lowered.

The present invention has been made to overcome the above-mentioned drawbacks, and it is an object of the present invention to provide a semiconductor device which can realize the miniaturization of the semiconductor device compared to a semiconductor device having a guard ring structure, and can increase a breakdown strength of the whole device compared to conventional semiconductor devices.

Solution to Problem

[1] A semiconductor device according to present invention is a semiconductor device which includes: a semiconductor base substrate of a first conductive type; a first semiconductor region of a second conductive type formed on a surface of a first main surface of the semiconductor base substrate, the first semiconductor region having a plurality of first corner portions and a plurality of first side portions; a surface semiconductor region of a second conductive type formed on the surface of the first main surface so as to include a region where the surface semiconductor region overlaps with the first semiconductor region as viewed in a plan view, the surface semiconductor region having a plurality of second corner portions and a plurality of second side portions formed so as to surround the first semiconductor region as viewed in a plan view, and the surface semiconductor region having dopant concentration lower than dopant concentration of the first semiconductor region; an insulation film formed on the surface of the first main surface in a range from a region where the first semiconductor region is formed to a region outside the surface semiconductor region as viewed in a plan view; a first semiconductor region side electrode formed in a region overlapping with the first semiconductor region as viewed in a plan view; and a field plate formed in a region overlapping with the surface semiconductor region as viewed in a plan view by way of the insulation film, the field plate having a plurality of field plate corner portions and a plurality of field plate side portions, wherein assuming a total length of the surface semiconductor region from an outer edge of the first semiconductor region to an outer edge of the surface semiconductor region as viewed in a plan view of the second corner portion as L1, and assuming a total length of the surface semiconductor region from the outer edge of the first semiconductor region to the outer edge of the surface semiconductor region as viewed in a plan view of the second side portion as L2, and assuming a length from the outer edge of the first semiconductor region side electrode to the outer edge of the field plate as viewed in a plan view of the field plate corner portion as FP1, and assuming a length from the outer edge of the first semiconductor region side electrode to the outer edge of the field plate as viewed in a plan view of the field plate side portion as FP2, at least one of a condition (1) that a relationship of L1>L2 is established at least at a portion of the surface semiconductor region and a condition (2) that a relationship of FP1>FP2 is established at least at a portion of the field plate is satisfied, and a withstand voltage of the second side portion is lower than a withstand voltage of the second corner portion.

[2] In the semiconductor device described in the above-mentioned [1], it is preferable that the condition that the relationship of L1>L2 is established at least at the portion of the surface semiconductor region be satisfied, and a recessed portion indented toward an inside as viewed in a plan view be formed on the outer edge of the second side portion.

[3] In the semiconductor device described in the above-mentioned [2], it is preferable that the surface semiconductor region be not formed at least in a first region disposed at a position remote from an outer edge of the second side portion as viewed in a plan view.

[4] In the semiconductor device described in the above-mentioned [3], it is preferable that the recessed portion be formed such that a portion of a bottom of the recessed portion forms a straight line extending in an x direction which is a direction directed from one said second corner portion to the other said second corner portion between the second corner portions disposed adjacently to each other as viewed in a plan view, a shape of the recessed portion be a tapered shape where the first semiconductor region side is narrow as viewed in a plan view, and a shape of the first region be a strip shape extending in a direction along the x direction as viewed in a plan view.

[5] In the semiconductor device described in the above-mentioned [1], it is preferable that the condition that the relationship of L1>L2 is established at least at the portion of the surface semiconductor region be satisfied, and the surface semiconductor region be not formed at least in a first region disposed at a position remote from an outer edge of the second side portion as viewed in a plan view.

[6] In the semiconductor device described in any one of the above-mentioned [3] to [5], it is preferable that a high resistance region having a larger electric resistance than the surface semiconductor region be formed at least at a portion of the first region.

[7] In the semiconductor device described in any one of the above-mentioned [3] to [6], it is preferable that the first region be disposed at a position where the first region overlaps with the field plate as viewed in a plan view.

[8] In the semiconductor device described in any one of the above-mentioned [3] to [7], it is preferable that the surface semiconductor region be not formed in a second region disposed at a position remote from the outer edge of the second corner portion as viewed in a plan view.

[9] In the semiconductor device described in the above-mentioned [8], it is preferable that the first region and the second region be formed continuously with each other.

[10] In the semiconductor device described in the above-mentioned [1], it is preferable that the condition that the relationship of FP1>FP2 is established at least at the portion of the field plate be satisfied.

[11] In the semiconductor device described in the above-mentioned [10], it is preferable that the condition that the relationship of L1>L2 is established at least at the portion of the surface semiconductor region be satisfied, and the surface semiconductor region be not formed at least in a first region disposed at a position remote from an outer edge of the second side portion as viewed in a plan view.

[12] In the semiconductor device described in the above-mentioned [11], it is preferable that a high resistance region having a larger electric resistance than the surface semiconductor region be formed at least at a portion of the first region.

Advantageous Effects of the Present Invention

The semiconductor device according to the present invention includes the surface semiconductor region without using guard rings and hence, a depletion layer can be formed in both the semiconductor base substrate and the surface semiconductor region when a reverse bias is applied. Accordingly, a desired withstand voltage can be obtained without increasing the number of surface semiconductor regions unlike the guard rings. As a result, the miniaturization of the semiconductor device can be realized compared to the semiconductor device having a guard ring structure.

According to the semiconductor device of the present invention, the surface semiconductor region is formed in the peripheral region and hence, when a reverse bias is applied, a depletion layer extends from a PN junction formed between the surface semiconductor region and the semiconductor base substrate firstly and, then, the surface semiconductor region is completely formed into a depletion layer. Accordingly, a withstand voltage of the semiconductor device can be increased. Further, at least one of the condition (1) that the relationship of L1>L2 is established at least at the portion of the surface semiconductor region and the condition (2) that the relationship of FP1>FP2 is established at least at the portion of the field plate is satisfied, and the withstand voltage of the second side portion is lower than the withstand voltage of the second corner portion and hence, the withstand voltage of the second side portion can be intentionally decreased thus making an avalanche breakdown occur in the second side portion preceding to the second corner portion of the surface semiconductor region when a reverse bias is applied whereby a breakdown strength of the whole device can be increased compared to conventional semiconductor devices.

Accordingly, the semiconductor device of the present invention can realize the miniaturization of the semiconductor device compared to a semiconductor device having a guard ring structure, and can increase a breakdown strength of the whole device compared to the conventional semiconductor device.

BRIEF DESCRIPTION OF DRAWINGS

FIG. 1A is a plan view of the semiconductor device 100, FIG. 1B is a cross-sectional view of the semiconductor device 100 taken along a line C1-C1 in FIG. 1A, and FIG. 1C is a cross-sectional view of the semiconductor device 100 taken along a line C2-C2 in FIG. 1A. In this specification, "plan view" is a view showing the semiconductor device as viewed from a first main surface side of a semiconductor base substrate. In the plan views in the respective drawings, to illustrate a shape of a surface semiconductor region 130 mainly, an insulation film 140, a first semiconductor region side electrode 152, and a protective insulation layer 180 are not illustrated, and with respect to a field plate 154, only an outer edge is illustrated with a line bolder than other lines. An inner edge of the field plate 154 (boundary between the field plate 154 and the first semiconductor region side electrode 152) is disposed at a position where the inner edge overlaps with an outer edge of the first semiconductor region 120 as viewed in a plan view. Further, in "plan views" in the respective drawings, portions of regions disposed on outer edges of the first semiconductor region 120 and the surface semiconductor region 130 where a thickness is decreased (portions relating to so-called side diffusion) are not illustrated. In the respective drawings including FIG. 1A to FIG. 1C, the drawings which show the configuration of the semiconductor device are schematic views, and sizes of the illustrated constitutional elements and the like do not necessarily correspond to sizes of actual constitutional elements.

In FIG. 3, symbol a indicates a graph relating to L1, and symbol b indicates a graph relating to L2.

FIG. 4A is a plan view of the semiconductor device 101, FIG. 4B is a cross-sectional view of the semiconductor device 101 taken along a line C1-C1 in FIG. 4A, and FIG. 4C is a cross-sectional view of the semiconductor device 101 taken along a line C2-C2 in FIG. 4A.

FIG. 8A is a plan view of the semiconductor device 102, FIG. 8B is a cross-sectional view of the semiconductor device 102 taken along a line C1-C1 in FIG. 8A, and FIG. 8C is a cross-sectional view of the semiconductor device 102 taken along a line C2-C2 in FIG. 8A.

FIG. 10A is a cross-sectional view corresponding to the cross-sectional view of the semiconductor device taken along a line C2-C2 (see FIG. 8C or the like) (the same understanding being applied when such a cross-sectional view is simply referred to as the cross-sectional view hereinafter), and FIG. 10B is a partially enlarged view of a portion corresponding to the portion shown in FIG. 9.

In FIG. 11, symbol e indicates a graph when a first region does not exist in the second side portion, and symbol f indicates a graph when the first region and the high resistance region exist in the second side portion. When the first region does not exist, surface dopant concentration in the high resistance region cannot be also considered and hence, a withstand voltage does not change whereby a graph indicated by symbol e becomes a straight line which does not depend on the surface dopant concentration.

FIG. 12A is a plan view of the semiconductor device 104, FIG. 12B is a cross-sectional view of the semiconductor device 104 taken along a line C1-C1 in FIG. 12A, and FIG. 12C is a cross-sectional view taken along a line C2-C2 in FIG. 12A.

In FIG. 13, symbol g indicates a graph relating to FP1, and symbol h indicates a graph relating to FP2.

FIG. 14A is a plan view of the semiconductor device 105, FIG. 14B is a cross-sectional view of the semiconductor device 105 taken along a line C1-C1 in FIG. 14A, and FIG. 14C is a cross-sectional view of the semiconductor device 105 taken along a line C2-C2 in FIG. 14A.

In FIG. 15, symbol i indicates a graph relating to the second corner portion, and symbol j indicates a graph relating to the second side portion.

FIG. 16A is a plan view of the semiconductor device 106, FIG. 16B is a cross-sectional view of the semiconductor device 106 taken along a line C1-C1 in FIG. 16A, and FIG. 16C is across-sectional view of the semiconductor device 106 taken along a line C2-C2 in FIG. 16A.

FIG. 17A is a plan view of the semiconductor device 107, FIG. 17B is a cross-sectional view of the semiconductor device 107 taken along a line C1-C1 in FIG. 17A, and FIG. 17C is across-sectional view of the semiconductor device 107 taken along a line C2-C2 in FIG. 17A.

FIG. 18A is a plan view of the semiconductor device 106a, FIG. 18B is a cross-sectional view of the semiconductor device 106a taken along a line C1-C1 in FIG. 18A, and FIG. 18C is a cross-sectional view of the semiconductor device 106a taken along a line C2-C2 in FIG. 18A.

FIG. 19A is a plan view of the semiconductor device 107a, FIG. 19B is a cross-sectional view of the semiconductor device 107a taken along a line C1-C1 in FIG. 19A, and FIG. 19C is a cross-sectional view of the semiconductor device 107a taken along a line C2-C2 in FIG. 19A.

FIG. 27A is a plan view of the semiconductor device 900, and FIG. 27B is a cross-sectional view taken along a line C-C in FIG. 27A. In FIG. 27A, to illustrate a shape of guard rings 930 mainly, an insulation film 940, a first semiconductor region side electrode 952, and a protective insulation layer 980 are not illustrated, and with respect to a field plate 954, only an outer edge is illustrated with a line bolder than other lines.

DESCRIPTION OF EMBODIMENTS

Figure 1A:
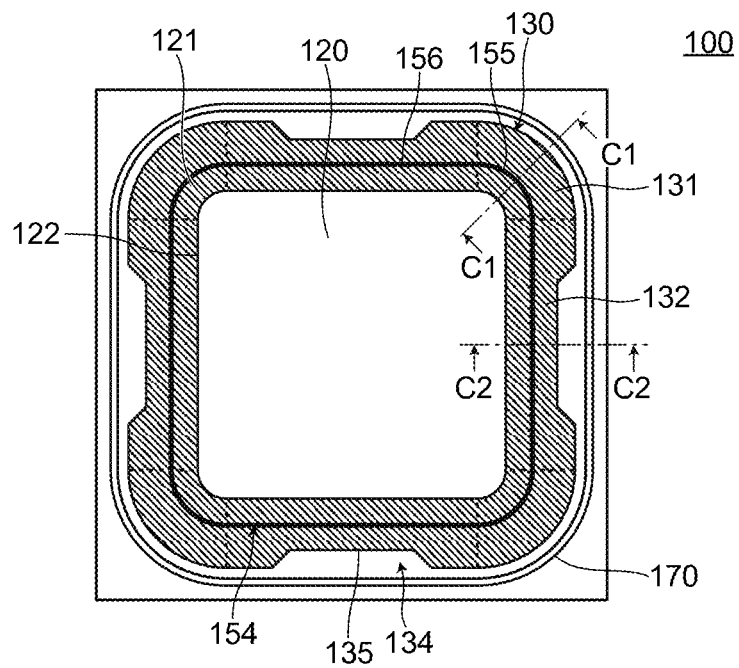
FIG. 1A to FIG. 1C are views for describing a semiconductor device 100 according to Embodiment 1.

Hereinafter, a semiconductor device according to the present invention is described based on embodiments shown in drawings. The respective embodiments described hereinafter do not intend to limit the invention according to Claims. Further, all elements described in the respective embodiments and all combinations of these elements are not always indispensable as solutions to problems according to the present invention. In the respective embodiments, with respect to the basic configuration and constitutional elements having the same technical features (including constitutional elements which are not completely the same with respect to shapes or the like), there may be cases where the configuration and the constitutional elements are indicated by using the same symbols, and the repeated description of the configuration and the constitutional elements is omitted.

Embodiment 1

A semiconductor device 100 according to Embodiment 1 is a so-called semiconductor chip.

As shown in FIG. 1, the semiconductor device 100 includes: a semiconductor base substrate 110 of a first conductive type (n-type in Embodiment 1); a first semiconductor region 120 of a second conductive type (p-type in Embodiment 1) formed on a surface of a first main surface of the semiconductor base substrate 110, the first semiconductor region 120 having a plurality of first corner portions 121 and a plurality of first side portions 122; a surface semiconductor region 130 of a second conductive type formed on the surface of the first main surface so as to include a region overlapping with the first semiconductor region 120 as viewed in a plan view, the surface semiconductor region 130 having a plurality of second corner portions 131 and a plurality of second side portions 132 formed so as to surround the first semiconductor region 120 as viewed in a plan view, and the surface semiconductor region 130 having lower dopant concentration than the first semiconductor region 120; an insulation film 140 formed on the surface of the first main surface within a range from a region where the first semiconductor region 120 is formed to a region outside the surface semiconductor region 130 as viewed in a plan view; a first semiconductor region side electrode 152 formed in a region overlapping with the first semiconductor region 120 as viewed in a plan view; and a field plate 154 formed in a region overlapping with the surface semiconductor region 130 as viewed in a plan view by way of an insulation film 140, the field plate 154 having a plurality of field plate corner portions 155 and a plurality of field plate side portions 156. The first semiconductor region side electrode 152 and the field plate 154 are formed continuously with each other thus forming a first electrode 150.

The semiconductor device 100 also includes, besides the above-mentioned constitutional elements, a second electrode 160, a channel stopper electrode 170, a protective insulation layer 180, and a channel stopper 190.

In this specification, "first side portion" means a portion of an outer edge portion of the first semiconductor region where an outer edge is formed of a straight line.

In this specification, "first corner portion" means a portion of the outer edge portion of the first semiconductor region where one first side portion and the other first side portion are connected with each other while changing an angle made by both first side portions. The first corner portion corresponds to a portion of a corner of the first semiconductor region.

In this specification, "second side portion" means a portion of the surface semiconductor region corresponding to the first side portion. It is also safe to say that the second side portion is a portion of the surface semiconductor region which exists on a direction side perpendicular to and outside the straight line of the outer edge of the first side portion as viewed in a plan view.

In this specification, "second corner portion" means a portion of the surface semiconductor region corresponding to the first corner portion. It is also safe to say that the second corner portion is a portion of the surface semiconductor region where one second side portion and the other second side portion are connected with each other while changing an angle made by both second side portions as viewed in a plan view.

In this specification, "outer edge of the semiconductor region" means an outer edge of a portion having a fixed depth (thickness) in the semiconductor region. That is, so-called side diffusion is not included in the outer edge of the semiconductor region.

In this specification, "outer edge" means an outer end of a constitutional element, and "outer edge portion" means a portion including the outer edge.

The semiconductor base substrate 110 includes an $n^+$-type semiconductor region 112, and an n-type semiconductor region 114 disposed on a first electrode 150 side of the $n^+$-type semiconductor region 112. A PN junction is formed between the n-type semiconductor region 114 and the surface semiconductor region 130.

Surface dopant concentration of the $n^+$-type semiconductor region 112 can be set to $1\times10^{20}$ cm$^{-3}$ or more, for example. A depth of the $n^+$-type semiconductor region 112 from a back surface (second electrode 160 side) (thickness of $n^+$-type semiconductor region 112) can be set to 5 to 90 µm.

Wafer specific resistance of the n-type semiconductor region 114 can be set to 60 to 70 Ω·cm, for example. A thickness of a wafer i layer of the n-type semiconductor region 114 can be set to 90 to 150 µm, for example.

It is preferable that the first semiconductor region 120 be a region surrounded by the plurality of first corner portions 121 and the plurality of first side portions 122 in a state where the first corner portion 121 and the first side portion 122 are alternately disposed. The first semiconductor region 120 according to Embodiment 1 has four first corner portions 121 and four first side portions 122 thus forming an approximately quadrangular (approximately square) shape.

Surface dopant concentration of the first semiconductor region 120 can be set to $1\times10^{16}$ to $5\times10^{19}=^{-3}$, for example. A depth of the first semiconductor region 120 can be set to 1 to 4 µm, for example.

It is preferable that the surface semiconductor region 130 be a region surrounded by the plurality of second corner portions 131 and the plurality of second side portions 132 in a state where the second corner portion 131 and the second side portion 132 are alternately disposed. The surface semiconductor region 130 according to Embodiment 1 has four second corner portions 131 and four second side portions 132 thus forming an approximately quadrangular (approximately square) shape.

A total amount of dopant of the surface semiconductor region 130 can be set to $5\times10^{11}$ to $12\times10^{11}$ cm$^{-2}$, for example. A depth of the surface semiconductor region 130 can be set to 3 to 6 µm, for example.

A relationship between a withstand voltage and a total amount of dopant of the surface semiconductor region is briefly described.

"total amount of dopant" means a value obtained by integrating concentration distribution in a depth direction from a surface of the surface semiconductor region.

Figure 2:
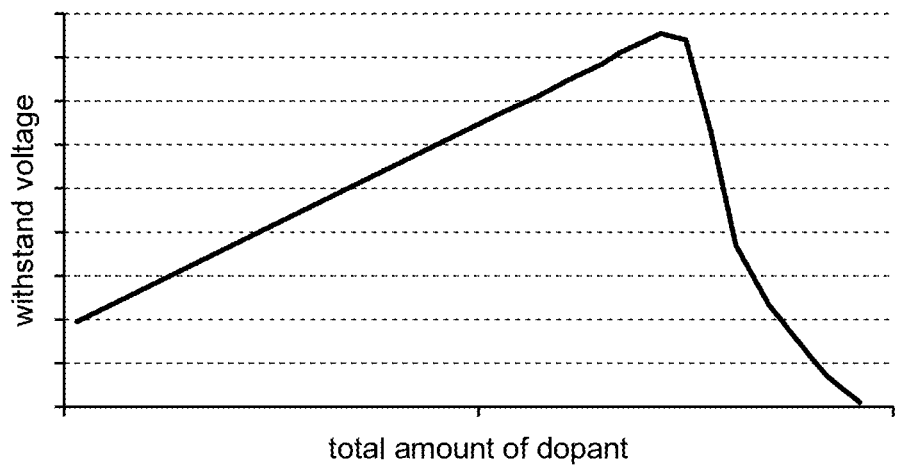
FIG. 2 is a graph for describing a relationship between a withstand voltage and a total amount of dopant. In the graph shown in FIG. 2, a withstand voltage of a second side portion is taken on an axis of ordinates, and a total amount of dopant in the surface semiconductor region is taken on an axis of abscissas. In the graph shown in FIG. 2, both along the axis of ordinates and the axis of abscissas, numerical values are increased in the positive direction, and the same definition is applied to the respective graphs described later. The graph shown in FIG. 2 is a graph schematically showing a relationship between the axis of ordinates and the axis of abscissas (graph showing substantially the tendency of the relationship) based on a simulation performed under conditions considered appropriate. Accordingly, specific numerical values are not given to the axis of ordinates and the axis of abscissas. Further, a result shown in the graph does not necessarily agree with a result obtained from an actual semiconductor device. This understanding is also applied to the respective graphs described later.

As shown in FIG. 2, by adjusting (increasing or decreasing) of a total amount of dopant of the surface semiconductor region, a withstand voltage can be adjusted (increased or decreased) within a range of several hundred V in a practical use of the semiconductor device.

Although a total amount of dopant is a value also relevant to a dose amount (dopant implanted amount), there may be a case where an appropriate correlation cannot be necessarily obtained between a withstand voltage and the dose amount. This is mainly attributed to a change in amount of dopant at the time of performing heat treatment.

As shown in FIG. 1, the second corner portion 131 has a planar shape chamfered in a round surface (smoothly connecting an outer edge of the second side portion 132 and an outer edge of the other second side portion 132) as viewed in a plan view.

The outer edge of the second corner portion 131 has an arc shape.

Figure 1B:
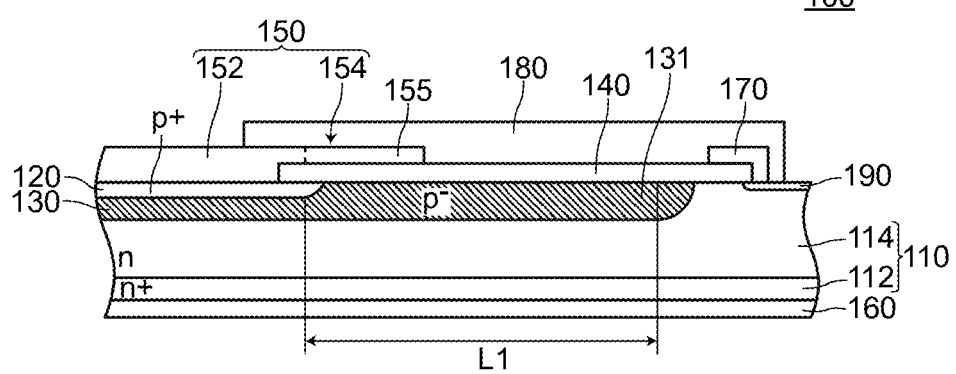
Figure 1C:
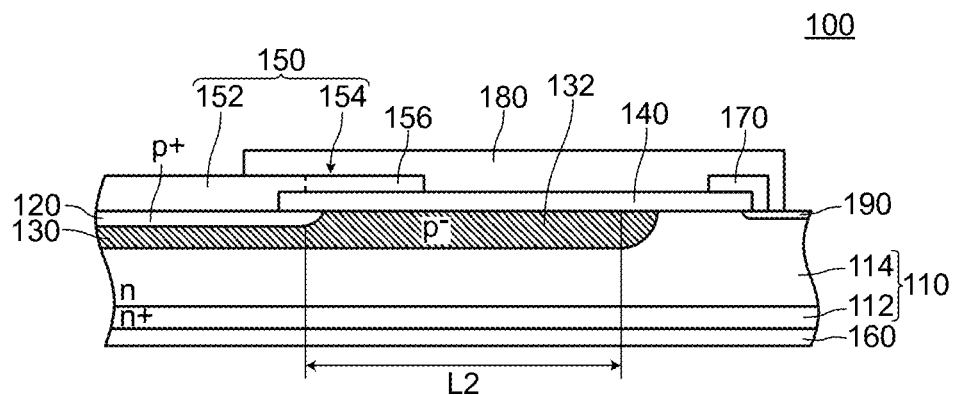

Assuming a total length of the surface semiconductor region 130 from the outer edge of the first semiconductor region 120 to the outer edge of the surface semiconductor region 130 as viewed in a plan view of the second corner portion 131 as L1, and assuming a total length of the surface semiconductor region 130 from the outer edge of the first semiconductor region 120 to the outer edge of the surface semiconductor region 130 as viewed in a plan view of the second side portion 132 as L2, the semiconductor device 100 satisfies a condition that a relationship of L1>L2 is established at least at a portion of the surface semiconductor region 130 (see FIG. 1B and FIG. 1C).

A withstand voltage of the second side portion 132 is lower than a withstand voltage of the second corner portion 131.

In this specification, to satisfy the condition "a relationship L1>L2 is satisfied at least at a portion of the surface semiconductor region", it is sufficient that L2 which is lower than L1 taking a largest value exist at least at a portion in the surface semiconductor region, and it is unnecessary that the relationship of L1>L2 be satisfied over entire regions of the second corner portions and the second side portions.

In this specification, "a withstand voltage of the second side portion is lower than a withstand voltage of the second corner portion" does not mean that a withstand voltage of all portions of the second side portion is lower than a withstand voltage of the second corner portion, but means that a withstand voltage of at least a portion of the second side portion is lower than a withstand voltage of a portion of the second corner portion where the withstand voltage is lowest.

In Embodiment 1, L1 of the surface semiconductor region 130 can beset to 300 µm, for example, and L2 can be set to 180 µm, for example.

In this specification, "a total length of the surface semiconductor region" means a length along which the surface semiconductor region is formed when the surface semiconductor region is viewed one dimensionally. That is, in a case where a region where the surface semiconductor region is not formed (a first region or a second region described later) exists, the total length of the surface semiconductor region does not include a length corresponding to the region (a width of the region) (see Embodiment 2 and FIG. 4C described later, for example). Further, the total length of the surface semiconductor region does not include a so-called side diffusion portion.

In Embodiment 1, in both the second corner portions 131 and the second side portions 132, the surface semiconductor region 130 is formed continuously from the inside to the outside (see FIG. 1B, FIG. 1C).

The semiconductor device 100 has recessed portions 134 indented toward the inside on the outer edges of the second side portions 132 as viewed in a plan view. In FIG. 1A, symbol 135 indicates a bottom of the recessed portion 134.

The shape of the recessed portion 134 is formed in a tapered shape where a width on a first semiconductor region 120 side (bottom 135 side) is narrow.

In this specification, "having recessed portions indented toward the inside on the outer edges of the second side portions as viewed in a plan view" means that the recessed portion is disposed in the second side portion, that is, ends of the recessed portion (points where the outer edge of the second side portion starts to be indented) do not enter the second corner portions.

The outer edge of the second side portion 132 in the vicinity of the second corner portion 131 (portion of the second side portion 132 on a more second corner portion 131 side than an end portion of the bottom 135 of the recessed portion 134) is formed of: a first straight portion extending in a direction from a terminal end of the outer edge of the second corner portion 131 to the other second corner portion 131; and a second straight portion extending from the first straight portion to the bottom 135 of the recessed portion 134 (forming the tapered shape of the recessed portion 134).

With such a configuration, a width of the second side portion 132 is gradually narrowed in the vicinity of the second corner portion 131.

Figure 3:
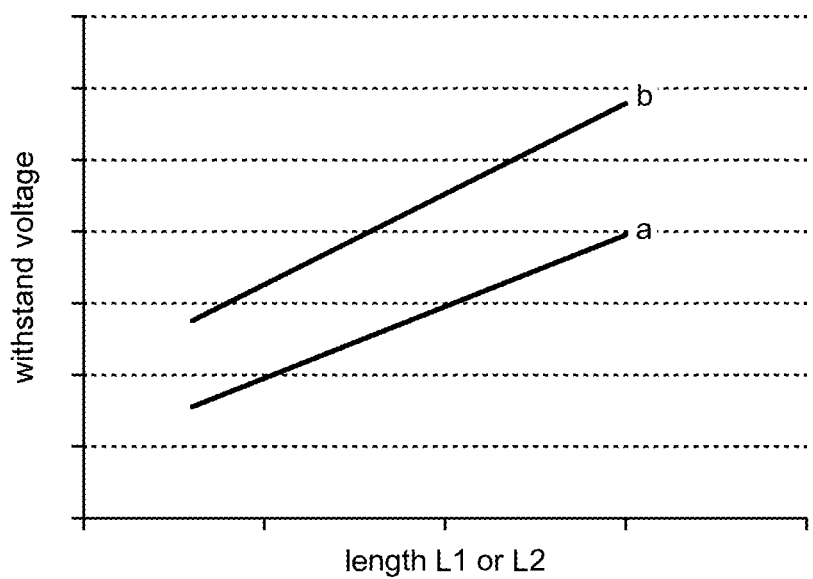
FIG. 3 is a graph for describing a relationship between a withstand voltage and a length L1 or L2. A withstand voltage of a second corner portion or a second side portion is taken on an axis of ordinates in the graph shown in FIG. 3, and the length L1 or L2 is taken on an axis of abscissas in the graph shown in FIG. 3.

A relationship between a withstand voltage and lengths L1, L2 is briefly described. In the case where the surface semiconductor region is continuously formed (the case where a region such as the first region described later where the surface semiconductor region is not formed does not exist), as shown in FIG. 3, the larger the length L1 or L2, the higher a withstand voltage becomes. Further, when the length L1 and the length L2 are equal, a withstand voltage of the second side portion becomes higher than the withstand voltage of the second corner portion.

Accordingly, to set a withstand voltage of the second side portion lower than a withstand voltage of the second corner portion so as to increase a breakdown strength of the whole device, it is necessary to set the length L2 sufficiently small compared to the length L1.

For example, to describe the above using graphs shown in FIG. 3, by setting L1 to a length at a right end of a segment of a graph a and by setting L2 to a length at a left end of a segment of a graph b, it is possible to give a certain degree of margin to the difference in withstand voltage. For example, assuming a withstand voltage corresponding to the right end of the segment of the graph a as 1900V and assuming a withstand voltage corresponding to the left end of the graph b as 1800V, it is possible to give a margin of 100V to the difference in withstand voltage. Accordingly, it is safe to say that the length L2 is set sufficiently short compared to the length L1.

It is preferable that the field plate 154 be a region surrounded by the plurality of field plate corner portions 155 and the plurality of field plate side portions 156 in a state where the field plate corner portion 155 and the field plate side portion 156 are disposed alternately. In Embodiment 1, the field plate 154 includes four field plate corner portions 155 and four field plate side portions 156 thus forming an approximately quadrangular (approximately square) shape.

In the field plate 154 according to Embodiment 1, assuming a length from the outer edge of the first semiconductor region side electrode 152 to the outer edge of the field plate 154 as viewed in a plan view of the field plate corner portion 155 as FP1 (the symbol not shown in the drawing), and assuming a length from the outer edge of the first semiconductor region side electrode 152 to the outer edge of the field plate 154 as viewed in a plan view of the field plate side portion 156 as FP2 (the symbol not shown in the drawing), a relationship of FP1=FP2 is established.

FP1 and FP2 in Embodiment 1 can be set to 60 μm, for example.

In this specification, "field plate side portion" means a portion corresponding to a first side portion of the field plate.

In this specification, "field plate corner portion" means a portion corresponding to a first corner portion of the field plate. It is also safe to say that "field plate corner portion" is a portion of the field plate where one field plate side portion and the other field plate side portion are connected with each other as viewed in a plan view.

Hereinafter, advantageous effects of the semiconductor device 100 according to Embodiment 1 are described.

The semiconductor device 100 according to Embodiment 1 includes the surface semiconductor region 130 without using guard rings and hence, the miniaturization of the semiconductor device can be realized compared to the semiconductor device having a guard ring structure.

Further, according to the semiconductor device 100 of Embodiment 1, the surface semiconductor region 130 is formed in the peripheral region and hence, when a reverse bias is applied, a depletion layer extends from the PN junction formed between the surface semiconductor region 130 and the semiconductor base substrate 110 firstly and, then, the surface semiconductor region 130 is completely formed into a depletion layer and hence, a withstand voltage of the semiconductor device 100 can be increased. Further, at least one of the condition (1) that the relationship of L1>L2 is established at least at a portion of the surface semiconductor region 130 and the condition (2) that the relationship of FP1>FP2 is established at least at a portion of the field plate is satisfied (the condition (1) in Embodiment 1), and a withstand voltage of the second side portion 132 is lower than a withstand voltage of the second corner portion 131 and hence, the withstand voltage of the second side portion 132 can be intentionally decreased thus making an avalanche breakdown occur in the second side portion 132 preceding to the second corner portion 131 of the surface semiconductor region 130 when a reverse bias is applied whereby a breakdown strength of the whole device can be increased compared to conventional semiconductor devices.

Accordingly, the semiconductor device 100 of Embodiment 1 can realize the miniaturization of the semiconductor device compared to a semiconductor device having a guard ring structure, and can increase a breakdown strength of the whole device compared to conventional semiconductor devices.

The semiconductor device 100 according to Embodiment 1 has recessed portions 134 indented toward the inside on the outer edges of the second side portions 132 as viewed in a plan view and hence, the condition that the relationship of L1>L2 is established at least at the portion of the surface semiconductor region 130 can be satisfied without difficulty.

According to the semiconductor device 100 of Embodiment 1, the recessed portion 134 is disposed in the second side portion 132 and hence, lowering of a withstand voltage of the second corner portion 131 can be prevented.

Embodiment 2

Figure 4A:
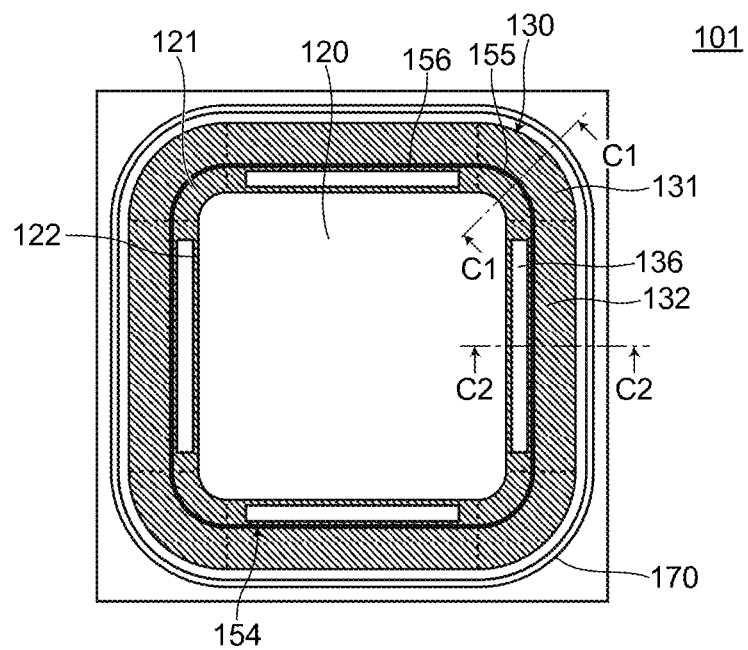
FIG. 4A to FIG. 4C are views for describing a semiconductor device 101 according to Embodiment 2.
Figure 4B:
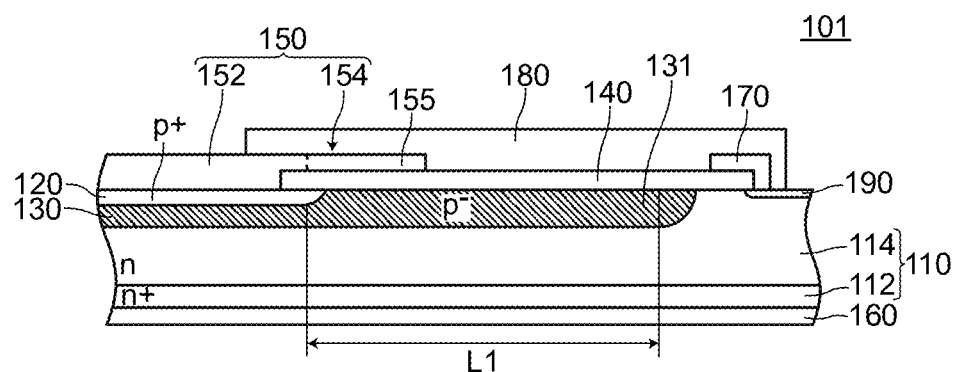
Figure 4C:
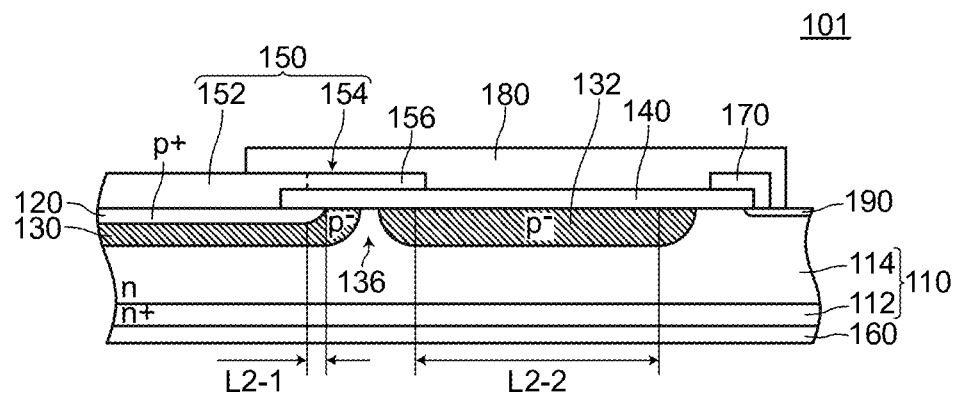

A semiconductor device 101 according to Embodiment 2 has substantially the same configuration as the semiconductor device 100 according to Embodiment 1 basically. However, the semiconductor device 101 according to Embodiment 2 differs from the semiconductor device 100 according to Embodiment 1 with respect to a point that first regions where a surface semiconductor region is not formed exist in the semiconductor device 101 according to Embodiment 2. That is, in the semiconductor device 101 according to Embodiment 2, as shown in FIGS. 4A to 4C, a surface semiconductor region 130 is not formed at least in first regions 136 disposed at positions spaced apart from outer edges of the second side portions 132 as viewed in a plan view.

As described previously, in a case where a region where the surface semiconductor region is not formed exists, "a total length of the surface semiconductor region" does not include a length (width) of the region. In Embodiment 2, due to the existence of the first regions 136, in the second side portions 132, there is a place where the surface semiconductor region 130 on an inner side and the surface semiconductor region 130 on an outer side are separated from each other (see FIG. 4C. In this case, a length L2 becomes a sum of a length of the surface semiconductor region 130 on the inner side (see symbol L2-1 in FIG. 4C) and a length of the surface semiconductor region 130 on the outer side (see symbol L2-2 in FIG. 4C).

In Embodiment 2, the first region 136 does not intrude toward a second corner portion 131 side beyond a boundary between the second corner portion 131 and the second side portion 132.

The first regions 136 are disposed at positions where the first regions 136 overlap with a field plate 154 as viewed in a plan view. It is also safe to say that the first regions 136 exist below the field plate 154 (second electrode 160 side), or the first regions 136 are covered by the field plate 154 by way of an insulation film 140.

In the semiconductor device 101 according to Embodiment 2, portions corresponding to the recessed portions 134 in Embodiment 1 do not exist.

A high resistance region (see Embodiment 4 described later) may be formed in the first regions 136.

A relationship between a withstand voltage and a width of the first region is briefly described. "a width of the first region" means, assuming a direction extending from one second corner portion to the other second corner portion between the second corner portions disposed adjacently to each other as an x direction, a length extending in a direction perpendicular to the x direction as viewed in a plan view (a length from a side of the first region on a first semiconductor region side to a side of the first region which opposedly faces the former side) (see symbol B shown in FIG. 9 described later). The width of the first region does not include a so-called side diffusion portion.

Figure 5:
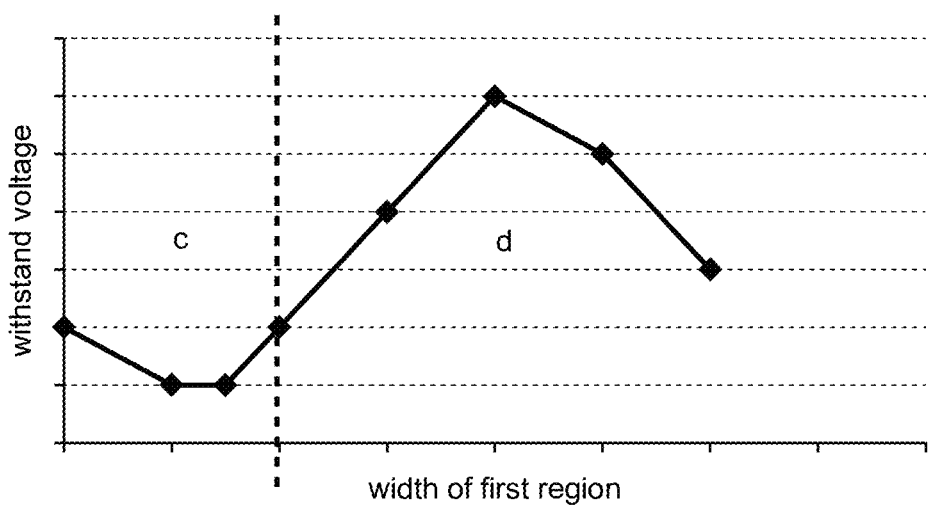
FIG. 5 is a graph for describing a relationship between a withstand voltage and a width of a first region. The withstand voltage of a second side portion is taken on an axis of ordinates in the graph shown in FIG. 5, and the width of the first region is taken on an axis of abscissas in the graph shown in FIG. 5. In the graph shown in FIG. 5, with respect to regions defined by a broken line, the region indicated by symbol c is a region where the withstand voltage of the second side portion is lowered compared to a case where the first region does not exit, and a region indicated by symbol d is a region where the withstand voltage of the second side portion is increased compared to the cases where the first region does not exist.

Assuming that the first region extends sufficiently long along the x direction, in a case where the width of the first region is relatively narrow, a withstand voltage of the second side portion becomes low compared to a case where the first region does not exist (see a region indicated by symbol c in FIG. 5). However, in a case where the width of the first region is increased to some extent, there may be a case where a withstand voltage of the second side portion becomes high compared to the case where the first region does not exist (see a region indicated by symbol d in FIG. 5). In view of the above, in Embodiment 2, it is necessary to set the width of the first region 136 such that a withstand voltage of the second side portion 132 becomes lower than a withstand voltage of the second corner portion 131. That is, it is necessary to set the width of the first region 136 to an appropriate value.

A relationship between electric field intensity and the first region is briefly described.

Figure 6:
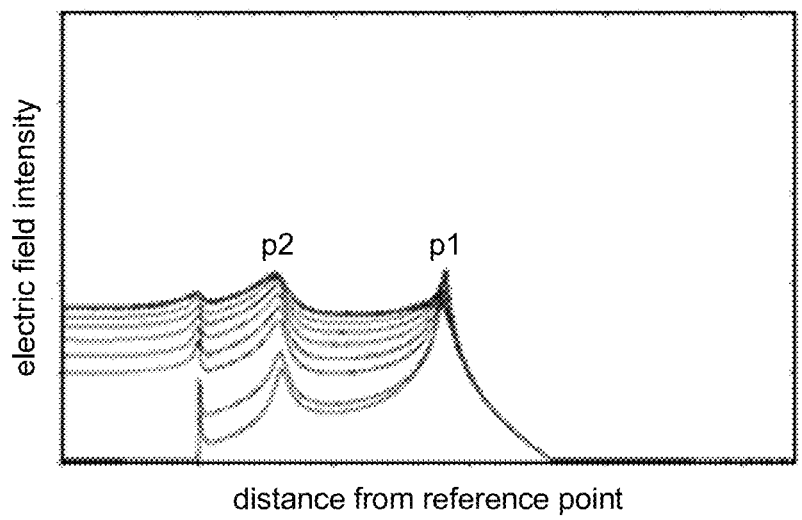
FIG. 6 is a graph for describing a relationship between electric field intensity and a distance from a reference point when a first region does not exist. Electric field intensity when avalanche current flows is taken on an axis of ordinates in FIG. 6, and a distance from a reference point is taken on an axis of abscissas. In the graph shown in FIG. 6, symbols p1, p2 indicate peaks of electric field intensity. "reference point" is an arbitrary point set in a region where a first semiconductor region is formed.
Figure 7:
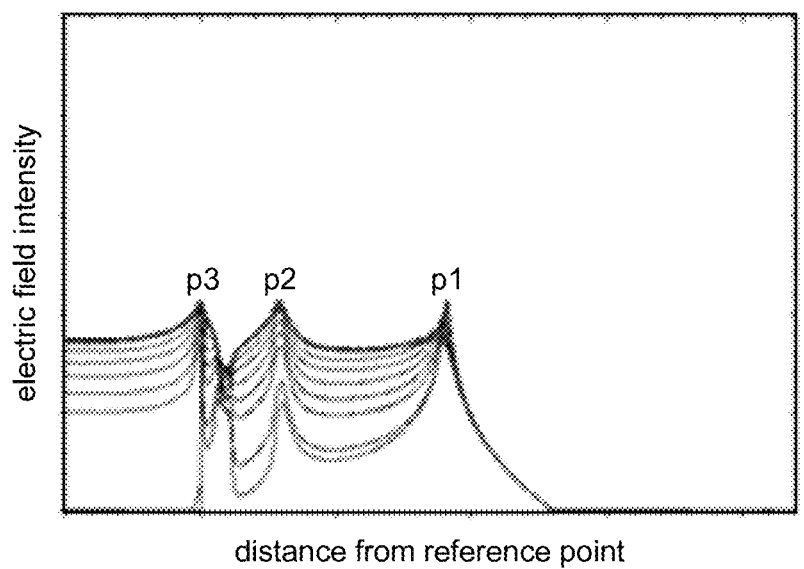
FIG. 7 is a graph for describing a relationship between electric field intensity and a distance from a reference point when a first region exists. Electric field intensity when avalanche current flows is taken on an axis of ordinates in FIG. 7, and a distance from the reference point is taken on an axis of abscissas. In the graph shown in FIG. 7, symbols p1, p2, p3 indicate peaks of electric field intensity. The points indicated by symbols p1, p2 in FIG. 7 and the points indicated by symbols p1, p2 in FIG. 6 are points which have the same distance from the reference point respectively. The reference point in FIG. 7 is disposed at the same position as the reference point in FIG. 6.
Figure 8A:
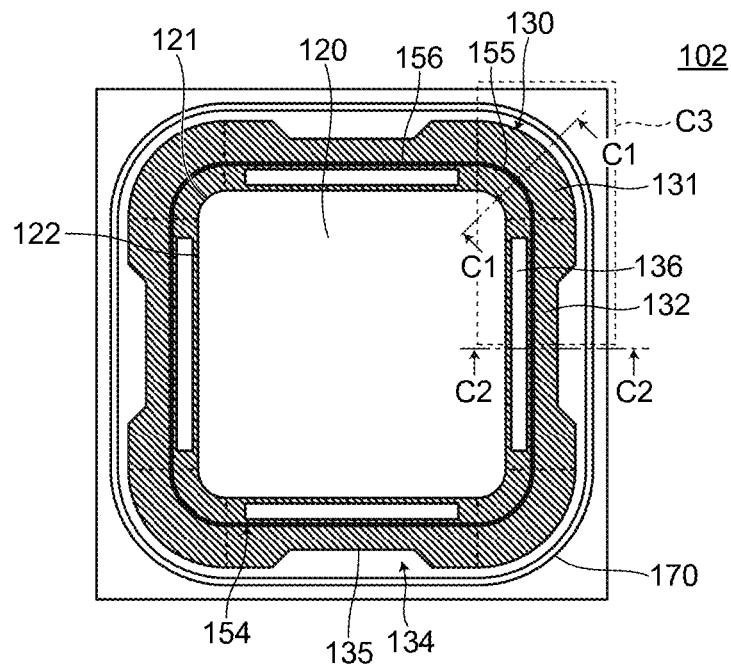
FIG. 8A to FIG. 8C are views for describing a semiconductor device 102 according to Embodiment 3.
Figure 8B:
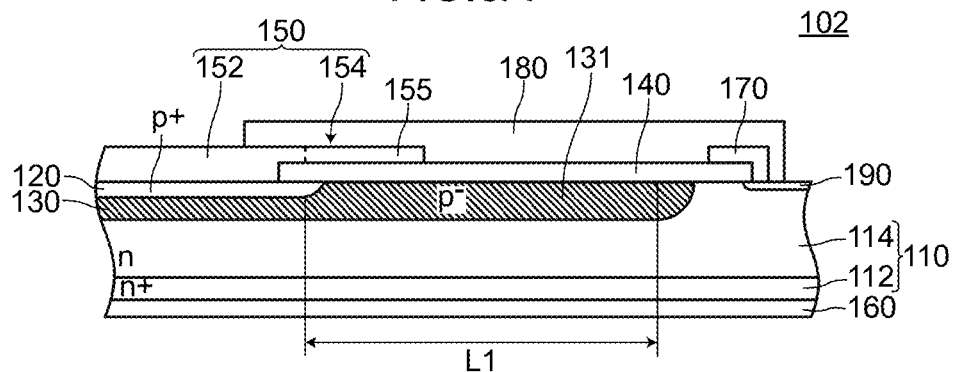
Figure 8C:
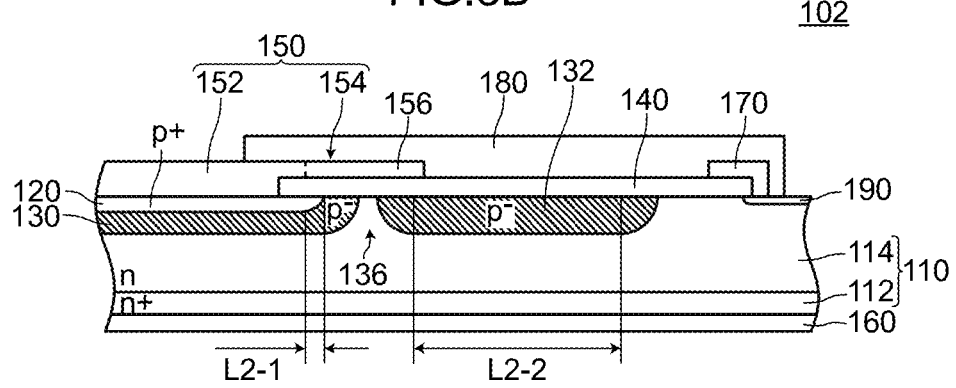

When an avalanche current flows in the semiconductor device 101, in a case where the first region does not exist, peaks of electric field intensity appear at two points, that is, a point in the vicinity of an outer edge of the surface semiconductor region (see symbol p1 in FIG. 6) and a point in the vicinity of an edge portion of the field plate (a side portion of the field plate) (see symbol p2 in FIG. 6). On the other hand, in a case where the first region exits, in addition to the above-mentioned two points, peak of electric field intensity appears also in the vicinity of the first region (see symbol p3 in FIG. 7). Accordingly, peaks of electric field intensity can be dispersed due to the existence of the first region. As a result, a breakdown strength of the whole semiconductor device can be increased.

Hereinafter, advantageous effects of the semiconductor device 101 according to Embodiment 2 are described.

In this manner, the semiconductor device 101 according to Embodiment 2 differs from the semiconductor device 100 according to Embodiment 1 with respect to a point that the first regions where the surface semiconductor region is not formed exist in the semiconductor device 101 according to Embodiment 2. However, the semiconductor device 101 according to Embodiment 2 includes the surface semiconductor region 130 without using a guard ring, a condition that the relationship of L1>L2 is established at least at the portion of the surface semiconductor region 130 is satisfied, and a withstand voltage of the second side portion 132 is lower than a withstand voltage of the second corner portion 131. Accordingly, in the same manner as the semiconductor device 100 according to the embodiment 1, the semiconductor device 102 of Embodiment 2 can realize the miniaturization of the semiconductor device compared to a semiconductor device having a guard ring structure, and can increase a breakdown strength of the whole device compared to conventional semiconductor devices.

According to the semiconductor device 101 of Embodiment 2, peaks of electric field intensity can be dispersed when an avalanche current flows in the semiconductor device 101, and the first region 136 is formed at the inside of the surface semiconductor region 130 which is a position where breakdown minimally occurs and hence, a breakdown strength of the whole device can be further increased.

According to the semiconductor device 101 of Embodiment 2, the first region 136 is disposed at the position where the first region 136 overlaps with the field plate 154 as viewed in a plan view and hence, irregularity in a withstand voltage can be decreased whereby it is possible to provide the semiconductor device having the stable structure from a view point of a withstand voltage.

According to the semiconductor device 101 of Embodiment 2, the first region 136 does not intrude into the second corner portion 131 side and hence, it is possible to prevent lowering of a withstand voltage of the second corner portion 131.

The semiconductor device 101 according to Embodiment 2 has substantially the same configuration as the semiconductor device 100 according to Embodiment 1 except for the point that the first regions where the surface semiconductor region is not formed exist in the semiconductor device 101 according to Embodiment 2. Accordingly, the semiconductor device 101 according to Embodiment 2 also possesses advantageous effects corresponding to advantageous effects which the semiconductor device 100 according to Embodiment 1 possesses among all advantageous effects which the semiconductor device 100 according to Embodiment 1 possesses.

Embodiment 3

A semiconductor device 102 according to Embodiment 3 has substantially the same configuration as the semiconductor device 100 according to Embodiment 1 basically. However, the semiconductor device 102 according to Embodiment 3 differs from the semiconductor device 100 according to Embodiment 1 with respect to a point that first regions where a surface semiconductor region is not formed exist in the semiconductor device 102 according to Embodiment 3. That is, in the semiconductor device 102 according to Embodiment 3, as shown in FIGS. 8A to 8C and FIG. 9, a surface semiconductor region 130 is not formed in first regions 136 disposed at positions spaced apart from outer edges of the second side portions 132 as viewed in a plan view.

With respect to recessed portions 134, a portion of a bottom 135 of the recessed portion 134 is formed of a straight line extending in an x direction (see FIG. 9) which is a direction from one second corner portion 131 to the other second corner portion 131 between the second corner portions 131 disposed adjacently to each other.

The shape of the recessed portion 134 is formed in a tapered shape where a first semiconductor region 120 side is narrow. A gradient of the tapered shape is 45°, for example.

In this specification, "a gradient of the tapered shape" relating to the recessed portion means a smaller angle out of angles formed by making a straight line perpendicular to the x direction and straight line extending along a tapered portion of the recessed portion intersect with each other.

The shape of the first region 136 is formed in a strip shape extending in a direction along the x direction as viewed in a plan view.

A size of the first region 136 in Embodiment 3 is described.

Figure 9:
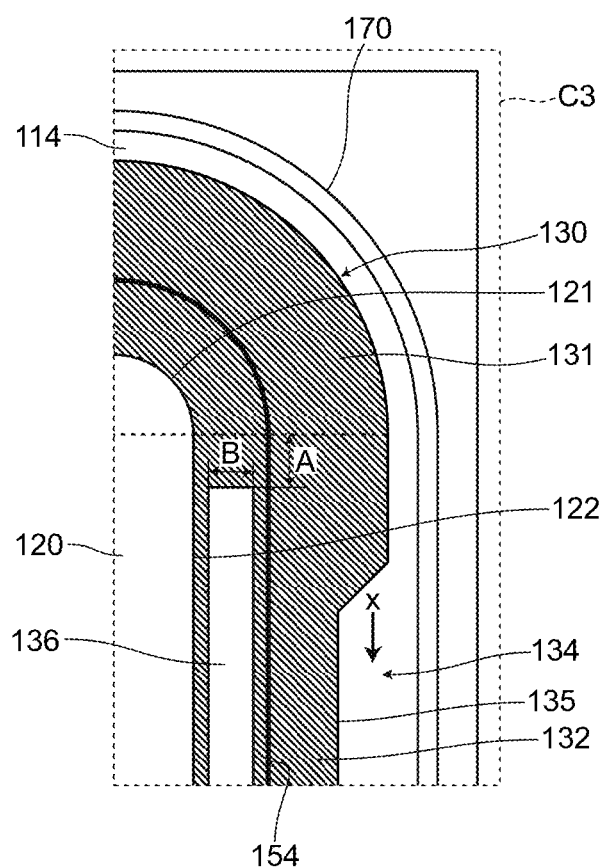
FIG. 9 is a partially enlarged view showing a portion indicated by C3 in FIG. 8A in an enlarged manner.

Assume a length along the x direction from an end portion of the first region 136 to a boundary between the second side portion 132 and the second corner portion 131 as viewed in a plan view as A, and a length of the first region 136 in a direction perpendicular to the x direction as viewed in a plan view (a width of the first region 136) as B (see FIG. 9).

In a graph of a relationship between a withstand voltage and the width of the first region (see FIG. 5), in a case where B is set relatively small (the width of the first region 136 is relatively small) and a withstand voltage of the second side portion 132 is low (see a region indicated by symbol c in FIG. 5), it is sufficient that A be an appropriate value of 0 or more (the value which prevents the first region 136 from intruding into a second corner portion 131 side beyond a boundary between the second side portion 132 and the second corner portion 131 and prevents the first region 136 from being extinguished).

Even in a case where B is relatively large (the width of the first region 136 is relatively large) and a withstand voltage of the second side portion 132 is high (see a region indicated by symbol d in FIG. 5), it is sufficient that A be an appropriate value of 0 or more.

B (the width of the first region 136) can be determined based on a relationship with a size and a withstand voltage of the semiconductor device. For example, B can be set to approximately 15 μm.

In this manner, the semiconductor device 102 according to Embodiment 3 differs from the semiconductor device 100 according to Embodiment 1 with respect to a point that the first regions where the surface semiconductor region is not formed exist. However, the semiconductor device 102 according to Embodiment 3 includes the surface semiconductor region 130 without using a guard ring, a condition that the relationship of L1>L2 is established at least at the portion of the surface semiconductor region 130 is satisfied, and a withstand voltage of the second side portion 132 is lower than a withstand voltage of the second corner portion 131. Accordingly, in the same manner as the semiconductor device 100 according to Embodiment 1, the semiconductor device 102 of Embodiment 3 can realize the miniaturization of the semiconductor device compared to a semiconductor device having a guard ring structure, and can increase a breakdown strength of the whole device compared to conventional semiconductor devices.

According to the semiconductor device 102 of Embodiment 3, the surface semiconductor region 130 is not formed in first regions 136 disposed at positions spaced apart from outer edges of the second side portions 132 as viewed in a plan view and hence, peaks of electric field intensity can be dispersed when an avalanche current flows in the semiconductor device 102. Further, the first region 136 is formed at the inside of the surface semiconductor region 130 which is a position where breakdown minimally occurs. Accordingly, a breakdown strength of the whole device can be further increased.

According to the semiconductor device 102 of Embodiment 3, a portion of the bottom 135 of the recessed portion 134 is formed of a straight line extending along an x direction as viewed in a plan view, the shape of the recessed portion 134 is formed in a tapered shape where the first semiconductor region 120 side is narrow as viewed in a plan view, and the shape of the first region 136 is formed in a strip shape extending in a direction along the x direction as viewed in a plan view and hence, it is possible to allow the recessed portion 134 and the first region 136 to exist parallel to each other and hence, a breakdown strength of the whole device can be further increased.

According to the semiconductor device 102 of Embodiment 3, the first region 136 does not intrude into the second corner portion 131 side and hence, it is possible to prevent lowering of a withstand voltage of the second corner portion 131.

The semiconductor device 102 according to Embodiment 3 has substantially the same configuration as the semiconductor device 100 according to Embodiment 1 except for the point that the first regions where the surface semiconductor region is not formed exist in the semiconductor device 102 according to Embodiment 3. Accordingly, the semiconductor device 102 according to Embodiment 3 also possesses advantageous effects corresponding to advantageous effects which the semiconductor device 100 according to Embodiment 1 possesses among all advantageous effects which the semiconductor device 100 according to Embodiment 1 possesses.

Embodiment 4

Figure 10A:
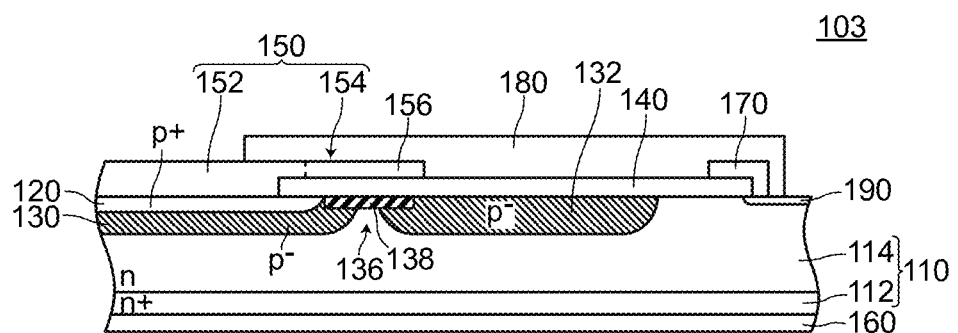
FIG. 10A and FIG. 10B are views for describing a semiconductor device 103 according to Embodiment 4.
Figure 10B:
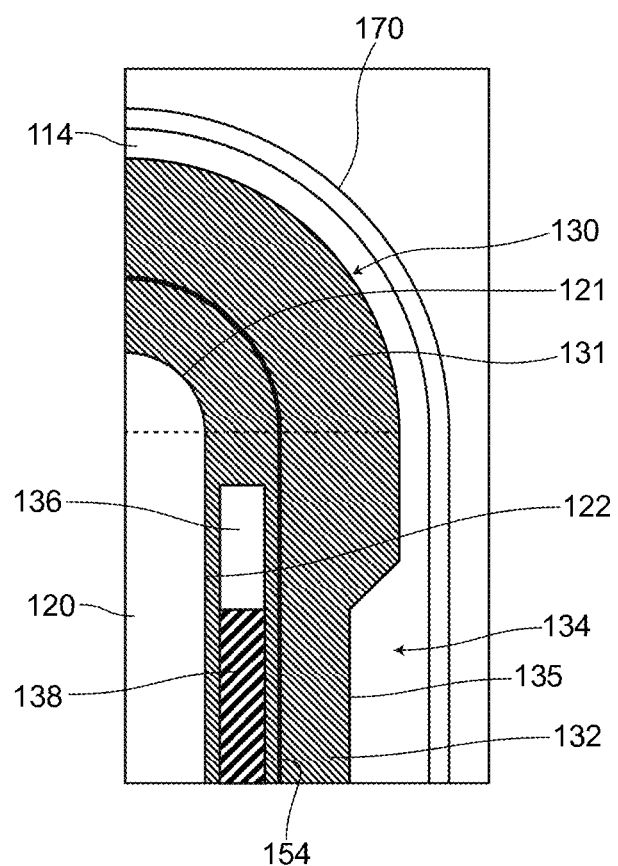

A semiconductor device 103 according to Embodiment 4 has substantially the same configuration as the semiconductor device 102 according to Embodiment 3 basically. However, the semiconductor device 103 according to Embodiment 4 differs from the semiconductor device 102 according to Embodiment 3 with respect to a point that high resistance regions are formed in the semiconductor device 103 according to Embodiment 4. That is, in the semiconductor device 103 according to Embodiment 4, as shown in FIG. 10A and FIG. 10B, a high resistance region 138 having larger electric resistance than a surface semiconductor region 130 is formed at least at a portion of a first region 136. The high resistance region 138 can decrease a withstand voltage of a second side portion 132 as will be described later.

In Embodiment 4, in the first region 136, the high resistance region 138 is formed in a region except for end portions of the first region 136 on a second corner portion 131 side. Such a configuration is adopted for making a withstand voltage of the second side portion 132 lower than a withstand voltage of a second corner portion 131.

For example, the high resistance region 138 can be formed by implanting a p-type dopant (for example, boron) at a position corresponding to the first region 136 and, thereafter, by applying annealing (heat treatment) to the p-type dopant implanted portion.

A relationship between a withstand voltage and surface dopant concentration of a high resistance region is briefly described.

"surface dopant concentration" means dopant concentration on a surface of the high resistance region.

Figure 11:
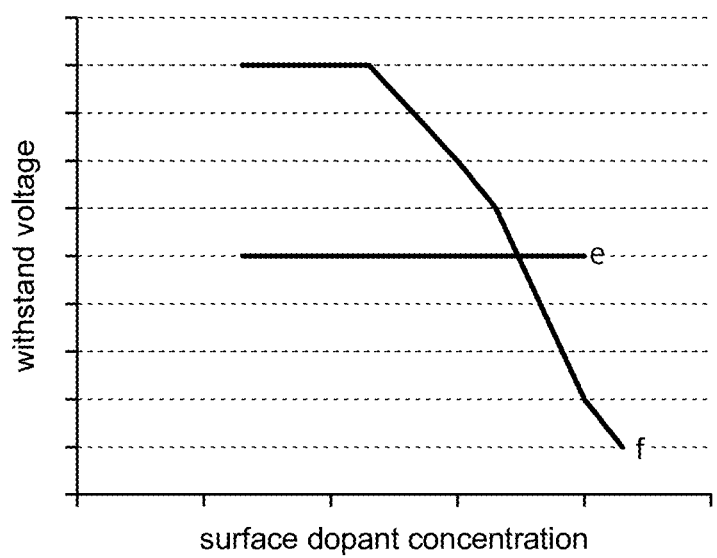
FIG. 11 is a view for describing a relationship between a withstand voltage and surface dopant concentration. The withstand voltage of a second side portion is taken on an axis of ordinates in the graph shown in FIG. 11, and the surface dopant concentration of a high resistance region is taken on an axis of abscissas in the graph shown in FIG. 11.

Basically, there is a tendency for a withstand voltage of a second side portion to decreased along with the increase of a surface dopant concentration of the high resistance region (see a graph indicated by f in FIG. 11).

Accordingly, even in the case where a withstand voltage of the second side portion is held high as it is due to the existence of the first region in the second side portion, for example (see a region indicated by symbol d in FIG. 5), by forming the high resistance region where surface dopant concentration is set to an appropriate value, it is possible to set a withstand voltage of the second side portion lower than a withstand voltage of the second side portion when the first region does not exist in the second side portion (see a region on a right side of an intersecting point where a graph indicated by symbol e and a graph indicated by symbol f intersect with each other in FIG. 11).

Even in the case where a withstand voltage of the second side portion becomes low due to the existence of the first region in the second side portion compared to a withstand voltage of the second side portion where the first region does not exist in the second side portion (see a region indicated by symbol c in FIG. 5), a high resistance region may be formed so as to adjust the withstand voltage.

From a viewpoint of total amount of dopant, a total amount of dopant in the high resistance region can be set to approximately 1/10 of a total amount of dopant in the surface semiconductor region, for example.

In this manner, the semiconductor device 103 according to Embodiment 4 differs from the semiconductor device 102 according to Embodiment 3 with respect to a point that high resistance regions are formed in the semiconductor device 103 according to Embodiment 4. However, the semiconductor device 103 according to Embodiment 4 includes the surface semiconductor region 130 without using a guard ring, a condition that the relationship of L1>L2 is established at least at the portion of the surface semiconductor region 130 is satisfied, and a withstand voltage of the second side portion 132 is lower than a withstand voltage of the second corner portion 131. Accordingly, in the same manner as the semiconductor device 102 according to Embodiment 3, the semiconductor device 103 of Embodiment 4 can realize the miniaturization of the semiconductor device compared to a semiconductor device having a guard ring structure, and can increase a breakdown strength of the whole device compared to conventional semiconductor devices.

Further, in the semiconductor device 103 according to Embodiment 4, the high resistance region 138 is formed at least at a portion of the first region 136. Accordingly, by adjusting the position of the high resistance region 138 or a total amount of dopant and surface dopant concentration, it is possible to make the withstand voltage distribution of the second side portion 132 uniform in a direction (x direction) from one second corner portion 131 to the other second corner portion 131 between the second side portion 132 and the second corner portion 131 disposed adjacently to the second side portion 132.

The semiconductor device 103 according to Embodiment 4 has substantially the same configuration as the semiconductor device 102 according to Embodiment 3 except for the point that the high resistance region is formed in the semiconductor device 103 according to Embodiment 4. Accordingly, the semiconductor device 103 according to Embodiment 4 also possesses advantageous effects corresponding to advantageous effects which the semiconductor device 102 according to Embodiment 3 possesses among all advantageous effects which the semiconductor device 102 according to Embodiment 3 possesses.

Embodiment 5

A semiconductor device 104 according to Embodiment 5 is a so-called semiconductor chip.

Figure 12A:
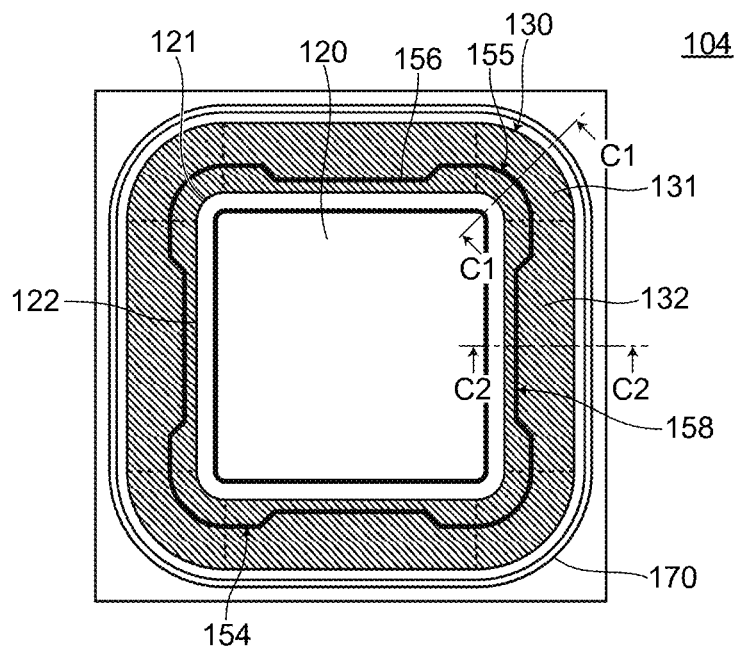
FIG. 12A to FIG. 12C are views for describing a semiconductor device 104 according to Embodiment 5.
Figure 12B:
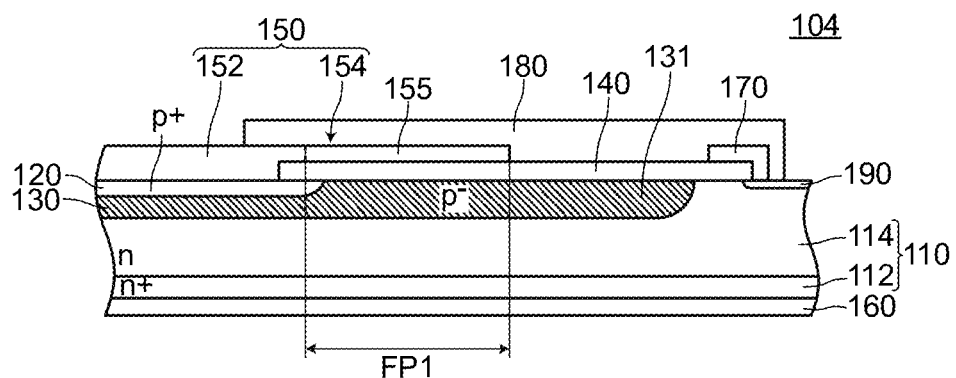
Figure 12C:
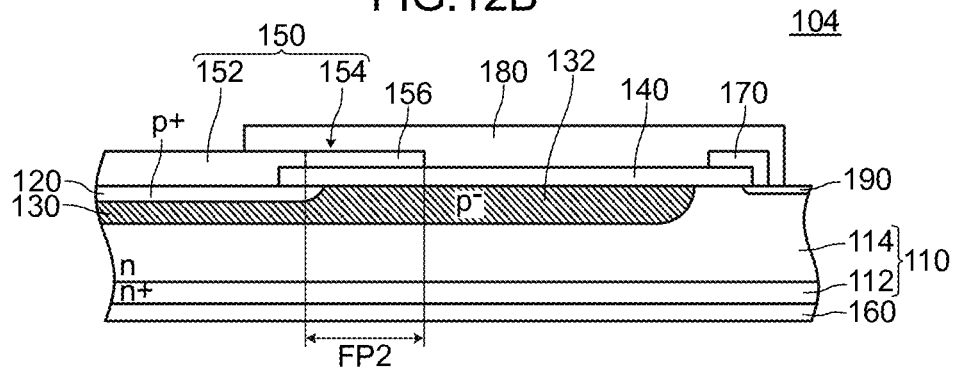

As shown in FIGS. 12A to 12C, the semiconductor device 104 includes: a semiconductor base substrate 110 of a first conductive type (n-type in Embodiment 5); a first semiconductor region 120 of a second conductive type (p-type in Embodiment 5) formed on a surface of a first main surface of the semiconductor base substrate 110, the first semiconductor region 120 having a plurality of first corner portions 121 and a plurality of first side portions 122; a surface semiconductor region 130 of a second conductive type formed on the surface of the first main surface so as to include a region overlapping with the first semiconductor region 120 as viewed in a plan view, the surface semiconductor region 130 having a plurality of second side portions 132 and a plurality of second corner portions 131 formed so as to surround the first semiconductor region 120 as viewed in a plan view, and the surface semiconductor region 130 having lower dopant concentration than the first semiconductor region 120; an insulation film 140 formed on the surface of the first main surface within a range from a region where the first semiconductor region 120 is formed to a region outside the surface semiconductor region 130 as viewed in a plan view; a first semiconductor region side electrode 152 formed in a region overlapping with the first semiconductor region 120 as viewed in a plan view; and a field plate 154 formed in a region overlapping with the surface semiconductor region 130 as viewed in a plan view by way of the insulation film 140, the field plate 154 having a plurality of field plate corner portions 155 and a plurality of field plate side portions 156. The first semiconductor region side electrode 152 and the field plate 154 are formed continuously with each other thus forming a first electrode 150.

The semiconductor device 104 also includes, besides the above-mentioned constitutional elements, a second electrode 160, a channel stopper electrode 170, a protective insulation layer 180, and a channel stopper 190.

Among constitutional elements of the semiconductor device 104 according to Embodiment 5, only the constitutional elements which differ from the constitutional elements of the semiconductor device 100 according to Embodiment 1 are described, and the description of other constitutional elements is omitted.

In this embodiment, assume a length from an outer edge of the first semiconductor region side electrode 152 to an outer edge of the field plate 154 in a plan view of the field plate corner portion 155 as FP1, and a length from an outer edge of the first semiconductor region side electrode 152 to an outer edge of the field plate 154 in a plan view of the field plate side portion 156 as FP2.

In this case, a condition that a relationship of FP1>FP2 is established at least at a portion of the field plate 154 is satisfied (see FIG. 12B, FIG. 12C). A withstand voltage of the second side portion 132 is lower than a withstand voltage of the second corner portion 131.

In this specification, to satisfy the condition "a relationship FP1>FP2 is satisfied at least at a portion of the field plate", it is sufficient that FP2 which is lower than FP1 taking a largest value exist at least at a portion in the field plate, and it is unnecessary that the relationship of FP1>FP2 be satisfied over entire regions of the field plate corner portion and the field plate side portion.

A recessed portion corresponding to the recessed portion 134 in the surface semiconductor region 130 in Embodiment 1 does not exist in Embodiment 5. On the other hand, the semiconductor device 100 has a recessed portion 158 indented toward the inside as viewed in a plan view on an outer edge of the field plate side portion 156.

Figure 13:
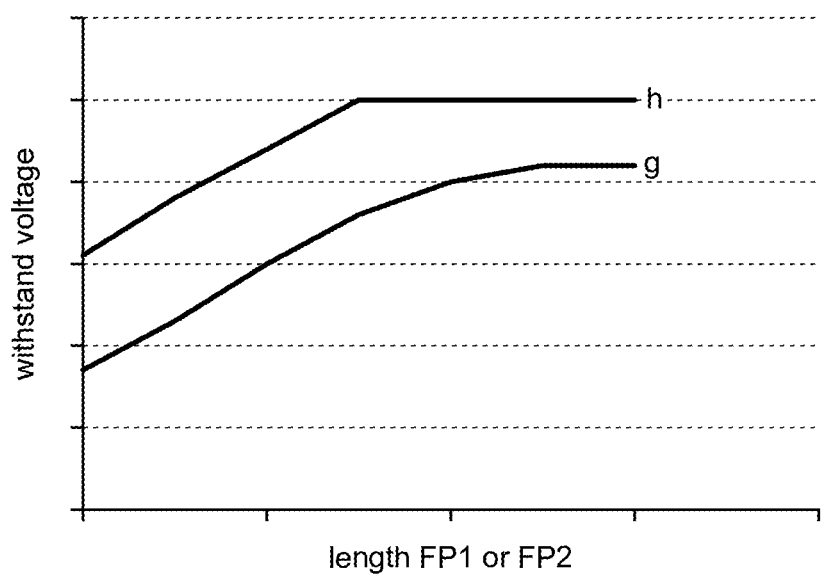
FIG. 13 is a graph for describing a relationship between a withstand voltage and a length FP1 or FP2. A withstand voltage of a second corner portion or a second side portion is taken on an axis of ordinates in the graph shown in FIG. 13, and the length FP1 or FP2 is taken on an axis of abscissas in the graph shown in FIG. 13.

A relationship between a withstand voltage and the length FP1 or the length FP2 is briefly described. As shown in FIG. 13, there is a tendency where the greater the length FP1 and the length FP2, the higher the withstand voltage at a portion corresponding to such a length becomes, and the withstand voltage does not change when such a length exceeds a certain length. Further, when the length FP1 and the length FP2 are equal, a withstand voltage of the second side portion becomes higher than the withstand voltage of the second corner portion.

Accordingly, to set a withstand voltage of the second side portion lower than a withstand voltage of the second corner portion so as to increase a breakdown strength of the whole device, it is necessary to set the length FP2 sufficiently small compared to the length FP1.

For example, to describe the above with reference to graphs shown in FIG. 13, in a case where the length FP2 is set for a rated voltage with a margin, and the length FP1 is set such that a withstand voltage of the second corner portion 131 becomes higher than a withstand voltage of the second side portion 132 with a margin (for example, assuming a withstand voltage corresponding to a position close to a left end of a segment of the graph h as 1850V and a withstand voltage corresponding to a right end of a segment of the graph g as 1920V, the margin becoming 70V), it is safe to say that the length FP1 is sufficiently long compared to length of FP2, that is, the length FP2 is set sufficiently short compared to the length FP1.

Hereinafter, advantageous effects of the semiconductor device 104 according to Embodiment 5 are described.

The semiconductor device 104 according to Embodiment 5 includes the surface semiconductor region 130 without using guard rings and hence, the miniaturization of the semiconductor device can be realized compared to the semiconductor device having a guard ring structure.

Further, according to the semiconductor device 104 of Embodiment 5, the surface semiconductor region 130 is formed in the peripheral region and hence, when a reverse bias is applied, a depletion layer extends from the PN junction formed between the surface semiconductor region 130 and the semiconductor base substrate 110 firstly and, then, the surface semiconductor region 130 is completely formed into a depletion layer and hence, a withstand voltage of the semiconductor device 104 can be increased. Further, at least one of the condition (1) that the relationship of L1>L2 is established at least at a portion of the surface semiconductor region 130 and the condition (2) that the relationship of FP1>FP2 is established at least at a portion of the field plate 154 is satisfied (the condition (2) in Embodiment 5), and a withstand voltage of the second side portion 132 is lower than a withstand voltage of the second corner portion 131 and hence, the withstand voltage of the second side portion 132 can be intentionally decreased thus making an avalanche breakdown occur in the second side portion 132 preceding to the second corner portion 131 of the surface semiconductor region 130 when a reverse bias is applied whereby a breakdown strength of the whole device can be increased compared to conventional semiconductor devices.

Accordingly, the semiconductor device 104 of Embodiment becomes a semiconductor device which can realize the miniaturization of the semiconductor device compared to a semiconductor device having a guard ring structure, and can increase a breakdown strength compared to conventional semiconductor devices.

Embodiment 6

Figure 14A:
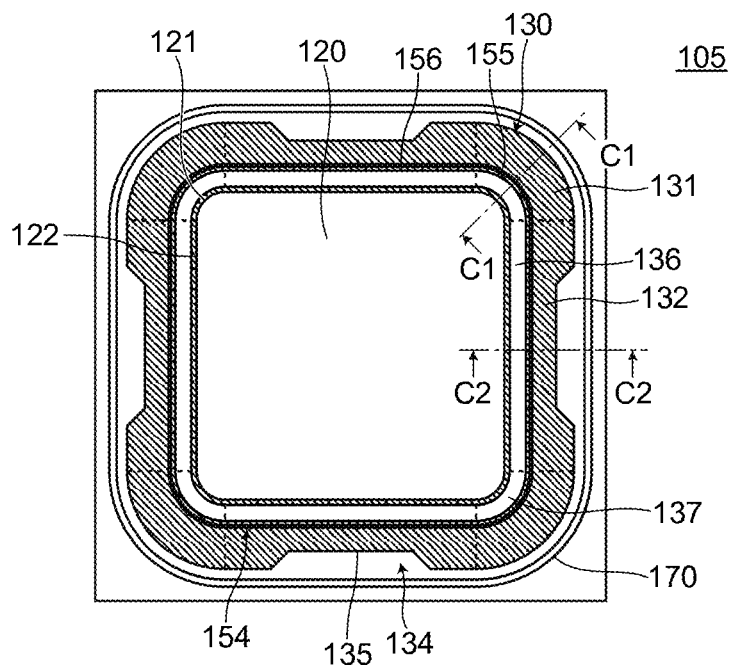
FIG. 14A to FIG. 14C are views for describing a semiconductor device 105 according to Embodiment 6.

A semiconductor device 105 according to Embodiment 6 has substantially the same configuration as the semiconductor device 102 according to Embodiment 3 basically. However, the semiconductor device 105 according to Embodiment 6 differs from the semiconductor device 102 according to Embodiment 3 with respect to a point that second regions where a surface semiconductor region is not formed exist. That is, in the semiconductor device 105 according to Embodiment 6, as shown in FIG. 14A, the surface semiconductor region 130 is not formed in the second regions 137 disposed at positions spaced apart from outer edges of the second corner portions 131 as viewed in a plan view.

End portions of the second region 137 are brought into contact with second side portions 132.

Figure 14B:
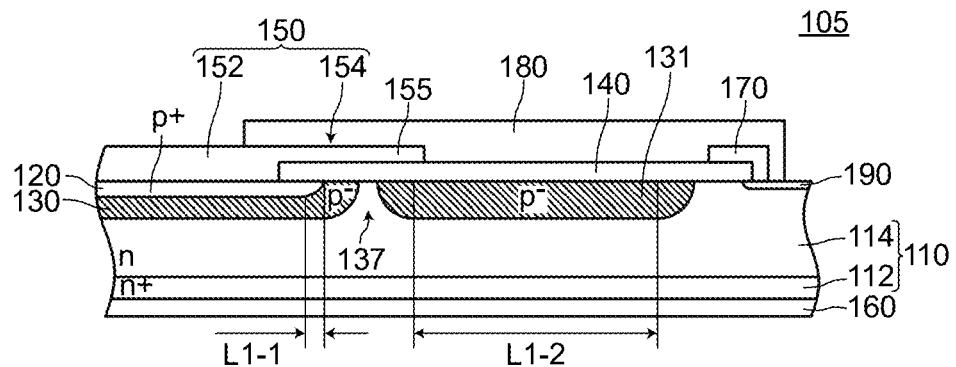
Figure 14C:
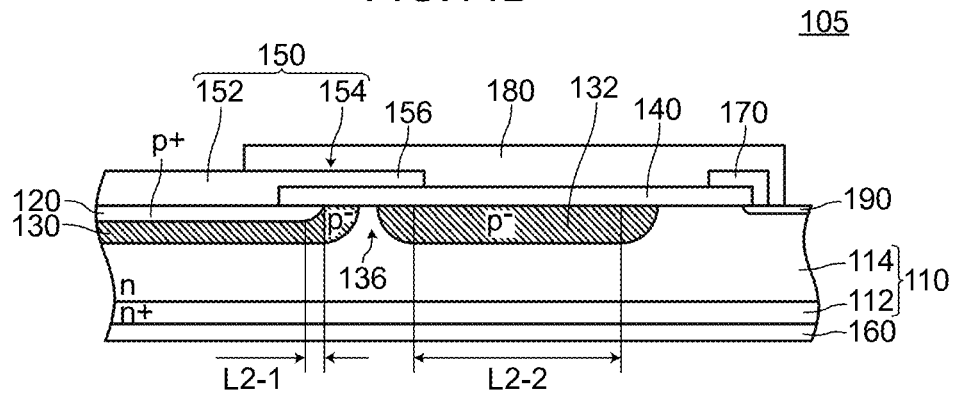

In Embodiment 6, a length L1 becomes a sum of a length of the surface semiconductor region 130 on the inner side (see symbol L1-1 in FIG. 14B) and a length of the surface semiconductor region 130 on the outer side (see symbol L1-2 in FIG. 14C).

In Embodiment 6, the first region 136 and the second region 137 are formed continuously with each other (an end portion of the first region 136 and an end portion of the second region 137 being brought into contact with each other).

A width of the first region 136 and a width of the second region 137 may be set equal to each other or may be set different from each other.

In this specification, "a width of the second region" means a length from a side of the second region on a first semiconductor region side to a side of the second region on a side opposite to the former side.

A high resistance region (see Embodiment 4) may be formed in the first region 136.

Figure 15:
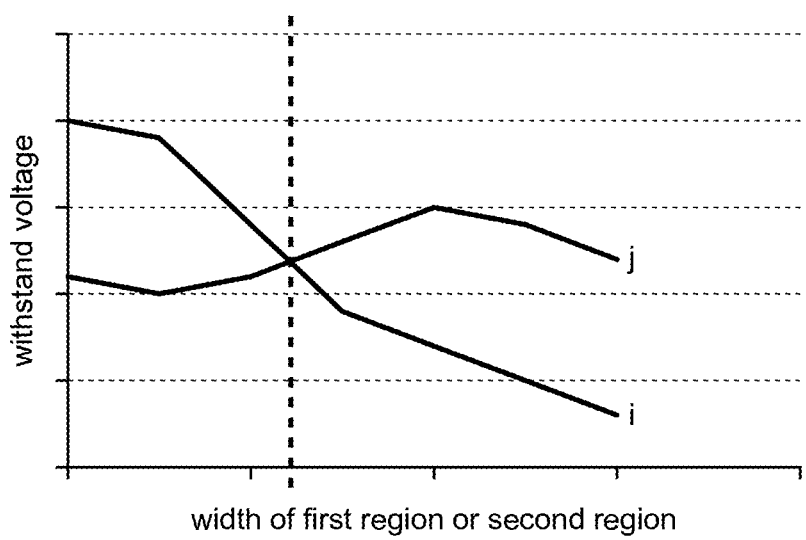
FIG. 15 is a graph for describing a relationship between a withstand voltage and a width of a first region or a second region. The withstand voltage is taken on an axis of ordinates in the graph shown in FIG. 15, and the width of the first region or the width of the second region is taken on an axis of abscissas in the graph shown in FIG. 15.

A relationship between a withstand voltage and a width of the first region or the second region is briefly described. As shown in FIG. 15, when the second region is disposed in the second corner portion, there is a tendency where the greater the width of the second region, the lower a withstand voltage of the second corner portion becomes. However, even when the second region exists in the second corner portion, depending on the width of the second region, there may be a case where a withstand voltage of the second corner portion can be set higher than a withstand voltage of the second side portion. For example, when the width of the first region and the width of the second region are equal to each other, provided that the width is a length corresponding to a region on a left side of a broken line shown in FIG. 15, a withstand voltage of the second corner portion can be set higher than a withstand voltage of the second side portion.

Accordingly, when the second region exists, it is necessary to set the width of the first region and the width of the second region such that a withstand voltage of the second corner portion does not become lower than a withstand voltage of the second side portion (a withstand voltage of the second side portion becoming lower than a withstand voltage of the second corner portion).

In this manner, the semiconductor device 105 according to Embodiment 6 differs from the semiconductor device 102 according to Embodiment 3 with respect to a point that the second regions where the surface semiconductor region is not formed exist. However, the semiconductor device 105 according to Embodiment 6 includes the surface semiconductor region 130 without using a guard ring, a condition that the relationship of L1>L2 is established at least at a portion of the surface semiconductor region 130 is satisfied, and a withstand voltage of the second side portion 132 is lower than a withstand voltage of the second corner portion 131. Accordingly, in the same manner as the semiconductor device 102 according to Embodiment 3, the semiconductor device 105 of Embodiment 6 becomes a semiconductor device which can realize the miniaturization of the semiconductor device compared to a semiconductor device having a guard ring structure, and can increase a breakdown strength compared to conventional semiconductor devices.

In the semiconductor device 105 according to Embodiment 6, the surface semiconductor region 130 is not formed in the second regions 137 disposed at positions spaced apart from outer edges of the second corner portions 131 as viewed in a plan view. Accordingly, not only a withstand voltage of the second side portion 132 but also a withstand voltage of the second corner portion 131 can be adjusted.

Further, in the semiconductor device 105 according to Embodiment 6, the first region 136 and the second region 137 are continuously formed and hence, it is possible to increase a withstand voltage of the whole semiconductor device by dividing the surface semiconductor region 130 into an area inside the first regions 136 and the second regions 137 and an area outside the first regions 136 and the second regions 137.

The semiconductor device 105 according to Embodiment 6 has substantially the same configuration as the semiconductor device 102 according to Embodiment 3 except for the point that the second regions where the surface semiconductor region is not formed exist. Accordingly, the semiconductor device 105 according to Embodiment 6 also possesses advantageous effects corresponding to advantageous effects which the semiconductor device 102 according to Embodiment 3 possesses among all advantageous effects which the semiconductor device 102 according to Embodiment 3 possesses.

Although the present invention has been described based on the above-mentioned respective embodiments, the present invention is not limited to the above-mentioned respective embodiments. The present invention can be carried out in various modes without departing from the gist of the present invention, and, for example, the following modifications are also conceivable.

(1) The numbers, materials, shapes, positions, sizes, angles and the like of the constitutional elements described in the above-mentioned respective embodiments are provided only for an exemplifying purpose, and can be changed within a scope where advantageous effects of the present invention are not impaired.

Figure 16A:
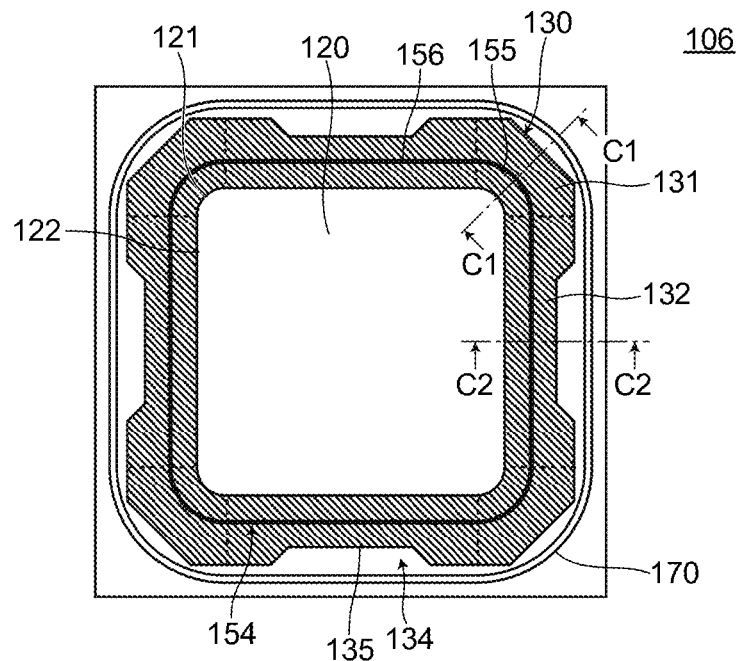
FIG. 16A to FIG. 16C are views for describing a semiconductor device 106 according to Modification 1.
Figure 16B:
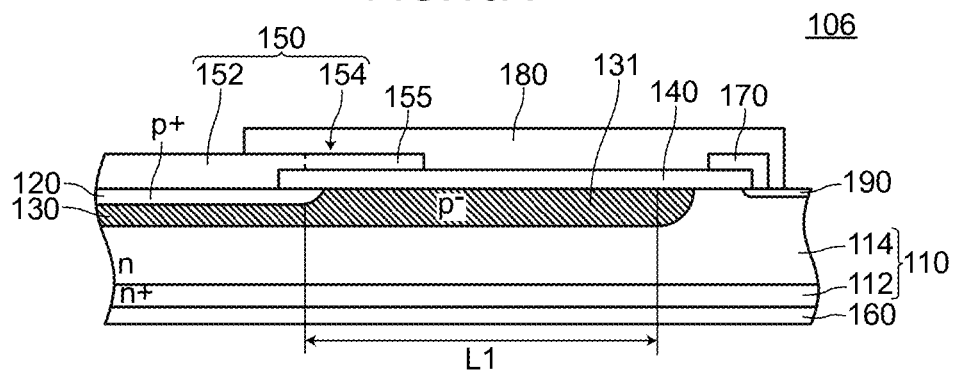
Figure 16C:
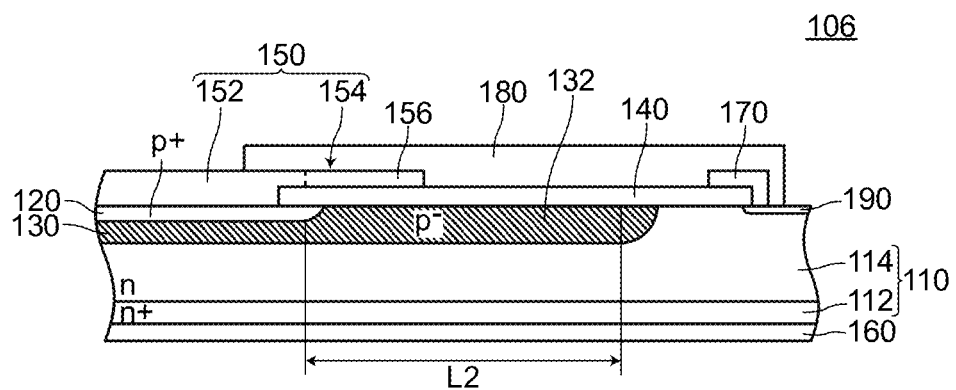
Figure 17A:
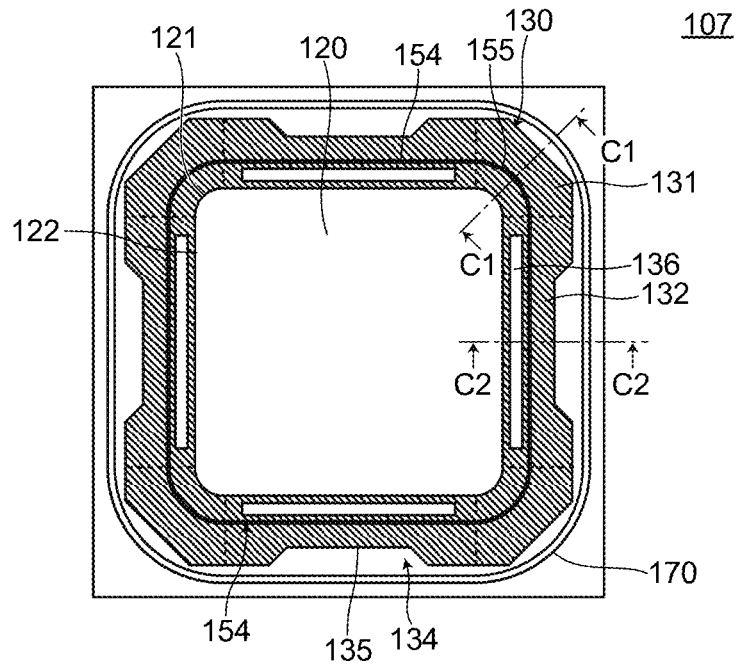
FIG. 17A to FIG. 17C are views for describing a semiconductor device 107 according to Modification 2.
Figure 17B:
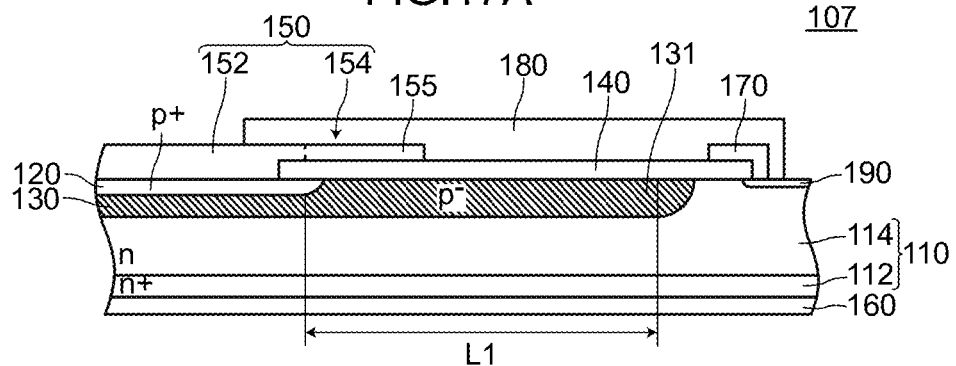
Figure 17C:
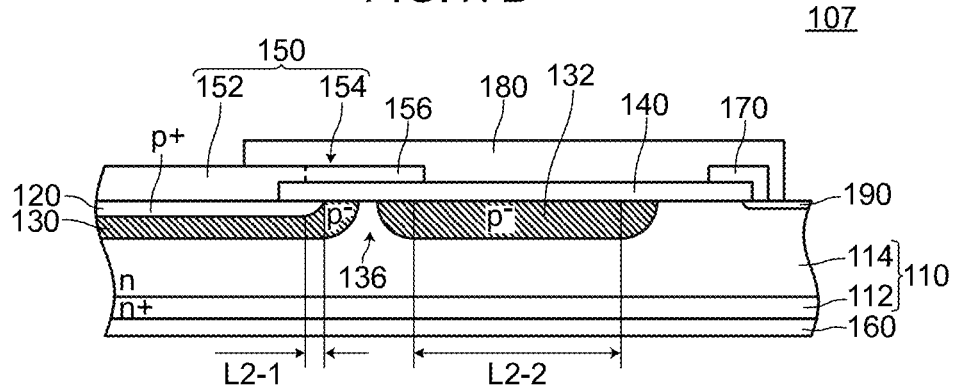

(2) In the above-mentioned respective embodiments, the second corner portion 131 has a planar shape chamfered in a round surface as viewed in a plan view. However, the present invention is not limited to such a configuration. For example, as in the case of a semiconductor device 106 according to Modification 1 (see FIG. 16A to FIG. 16C) and a semiconductor device 107 according to Modification 2 (see FIG. 17A to FIG. 17C), the second corner portion may have a planar shape chamfered in an angled surface as viewed in a plan view (a shape formed by connecting an outer edge of one second side portion and an outer edge of the other second side portion by a straight line).

Figure 18A:
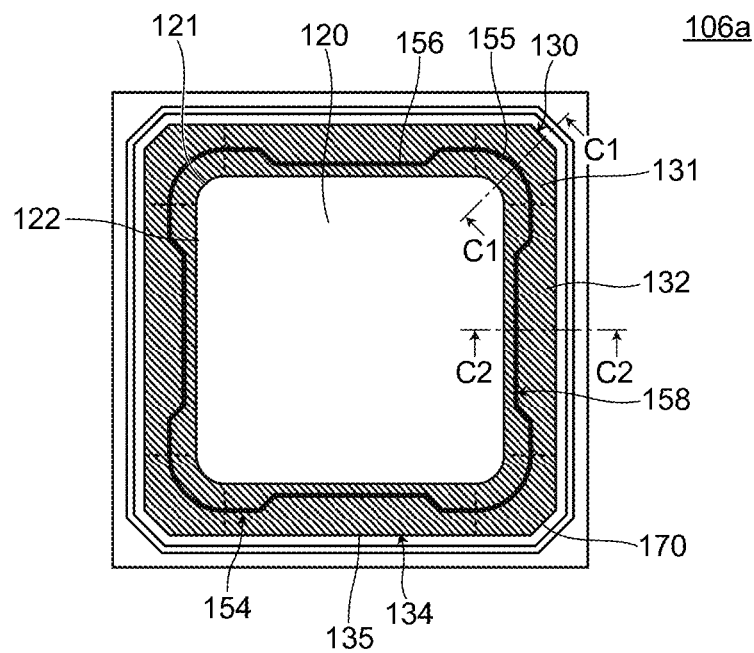
FIG. 18A to FIG. 18C are views for describing a semiconductor device 106a according to Modification 3.
Figure 18B:
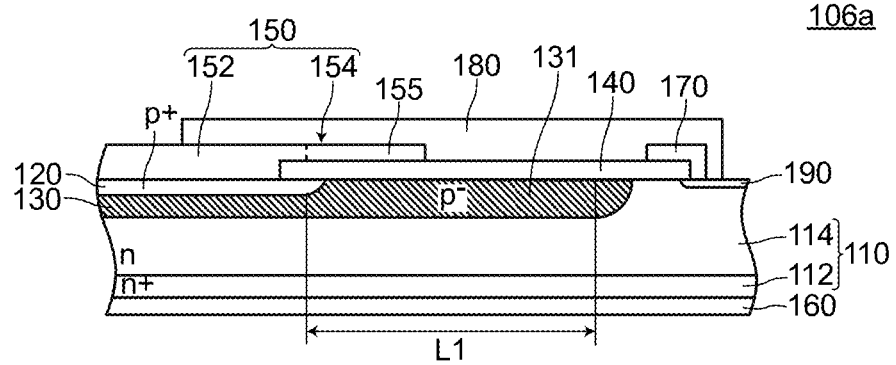
Figure 18C:
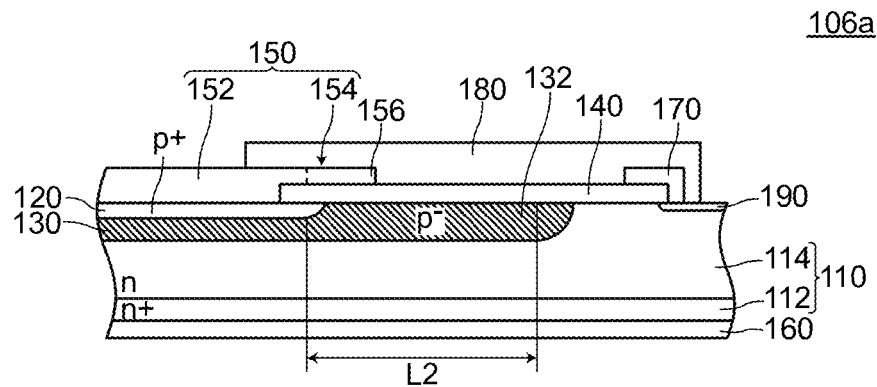
Figure 19A:
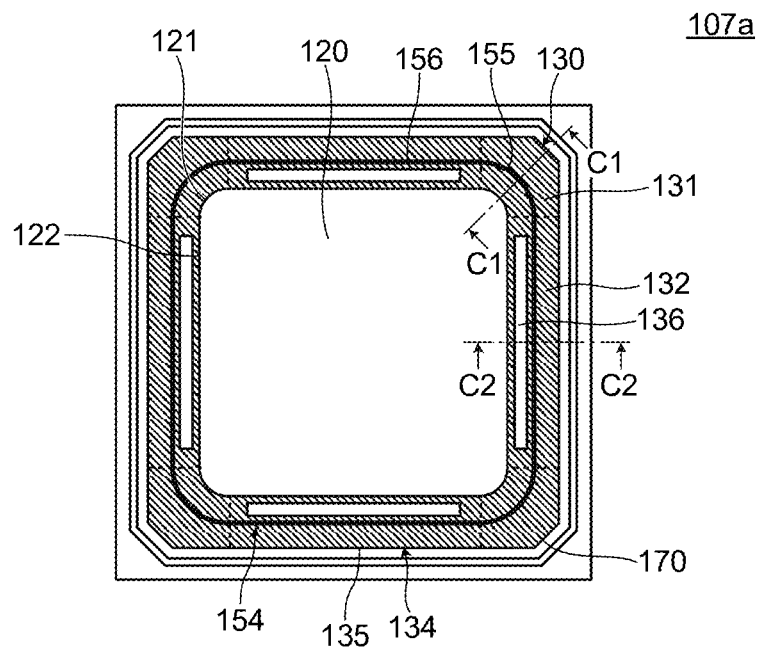
FIG. 19A to FIG. 19C are views for describing a semiconductor device 107a according to Modification 4.
Figure 19B:
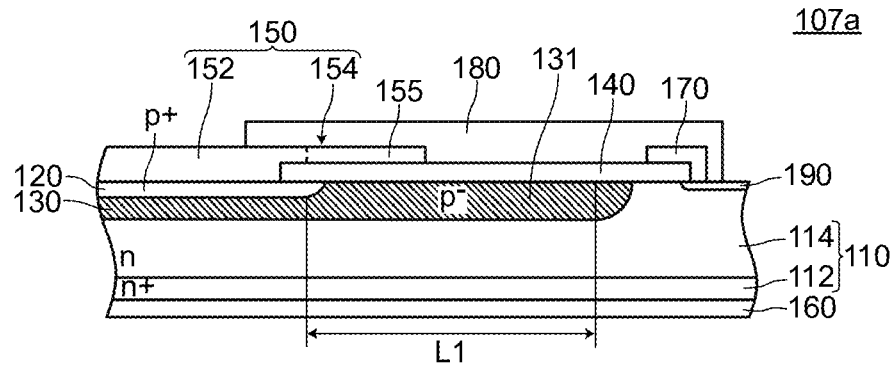
Figure 19C:
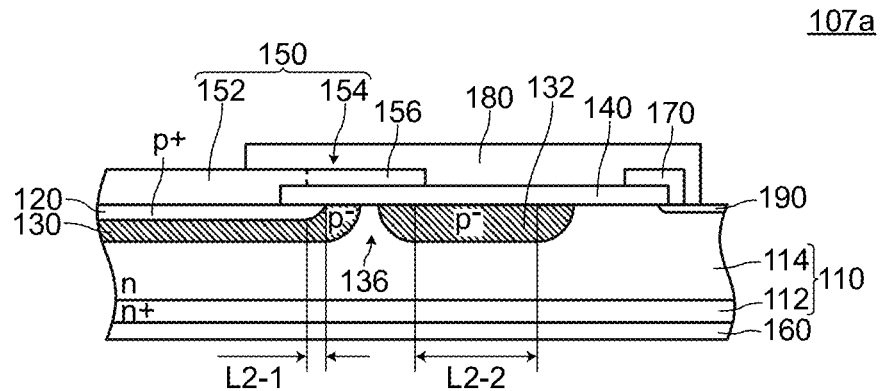

(3) Further, in the case where the second corner portion has a planar shape chambered in an angled shape as viewed in a plan view, as in the case of a semiconductor device 106a according to Modification 3 (see FIG. 18A to FIG. 18C) and a semiconductor device 107a according to Modification 4 (see FIG. 19A to FIG. 19C), a peripheral region can be made small compared to the case where the second corner portion has a planar shape chamfered in a round surface as viewed in a plan view. In this case, the further miniaturization of a size of the whole semiconductor device (chip size) can be realized.

Figure 20:
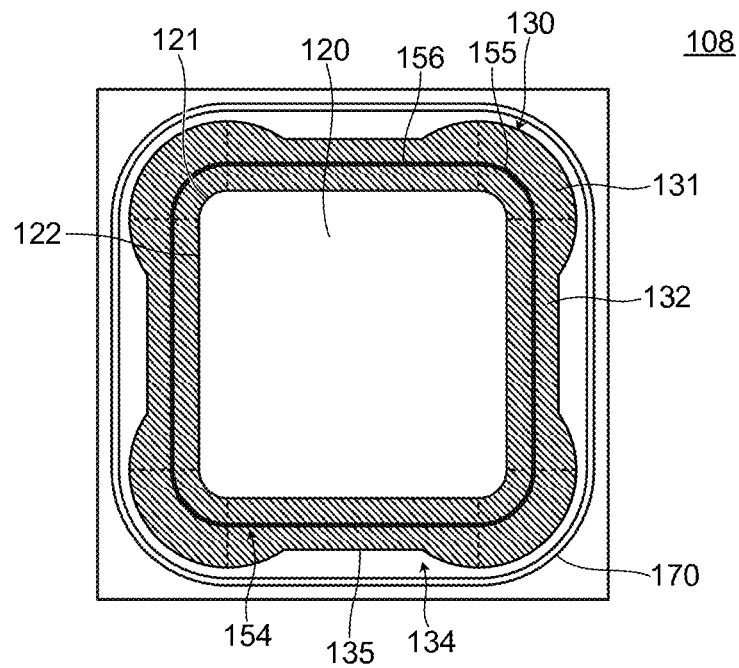
FIG. 20 is a plan view of a semiconductor device 108 according to Modification 5.

(4) In the above-mentioned respective Embodiments 1, 3, 4, and 6, an outer edge of the second side portion 132 in the vicinity of the second corner portion 131 is formed of: the first straight portion extending in the direction from the terminal end of the outer edge of the second corner portion 131 to the other second corner portion 131; and the second straight portion extending from the first straight portion to the bottom 135 of the recessed portion 134. However, the present invention is not limited to such a configuration. For example, as in the case of a semiconductor device 108 according to Modification 5 (see FIG. 20), an outer edge of a second side portion in the vicinity of a second corner portion may be formed in an arc shape formed continuously with an arc shape of an outer edge of the second corner portion. With such a configuration, it is possible to ensure a withstand voltage of the second corner portion in a stable manner. The technical feature that "an outer edge of a second side portion in the vicinity of a second corner portion may be formed in an arc shape formed continuously with an arc shape of an outer edge of the second corner portion" is also applicable to the semiconductor devices described in the above-mentioned Embodiments 3, 4, and 6.

Figure 21:
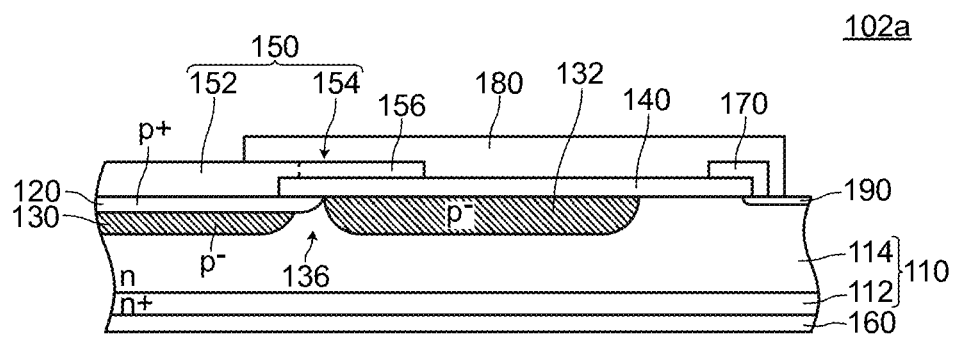
FIG. 21 is a cross-sectional view of a semiconductor device 102a according to Modification 6.
Figure 22:
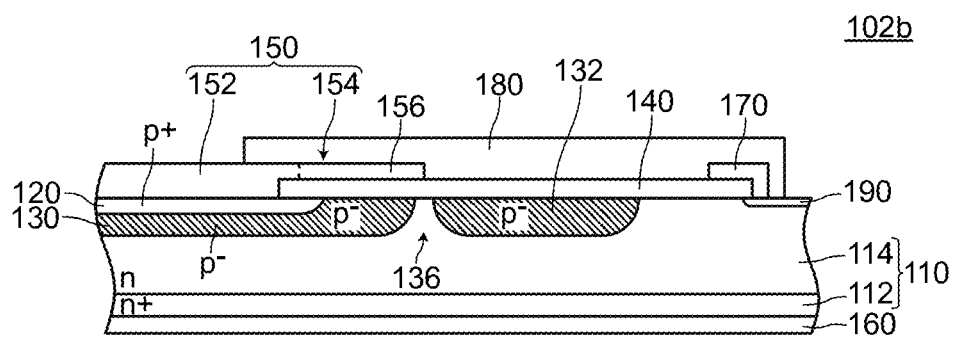
FIG. 22 is a cross-sectional view of a semiconductor device 102b according to Modification 7.
Figure 23:
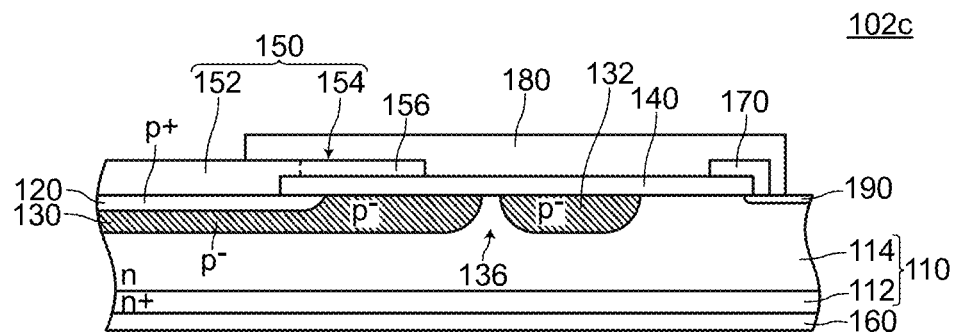
FIG. 23 is a cross-sectional view of a semiconductor device 102c according to Modification 8.

(5) In the above-mentioned Embodiments 2 to 4, 6 and the above-mentioned Modifications 2, 4, the position of the first region 136 is illustrated for an exemplifying purpose. The first region may be disposed inside the positions exemplified in Embodiments 2 to 4, 6 and Modifications 2, 4 as in the case of a semiconductor device 102a according to Modification 6 (see FIG. 21). Alternatively, the position of the first region may be disposed outside the positions exemplified in Embodiments 2 to 4, 6 and Modifications 2, 4 as in the case of a semiconductor device 102b according to Modification 7 (see FIG. 22) and a semiconductor device 102c according to Modification 8 (see FIG. 23). The above-mentioned configuration may be also adopted by the second region 137 described in the above-mentioned Embodiment 6 in the same manner as the first region 136.

Figure 24:
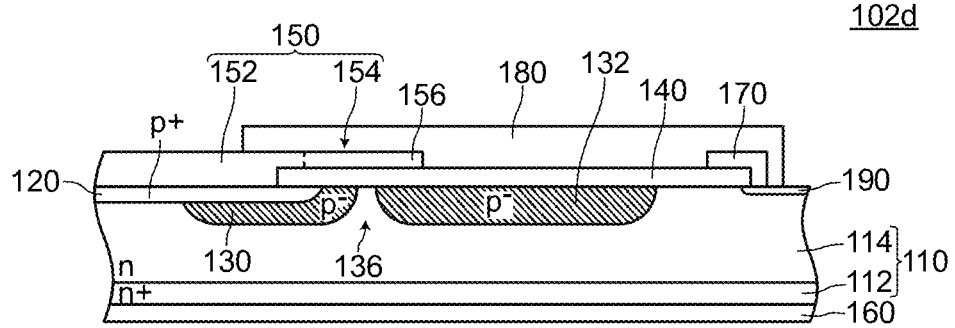
FIG. 24 is a cross-sectional view of a semiconductor device 102d according to Modification 9.

(6) In the above-mentioned respective embodiments, the surface semiconductor region 130 is formed also below the first semiconductor region 120 (second electrode 160 side). However, the present invention is not limited to such a configuration. A region where a surface semiconductor region is not formed may exist below a first semiconductor region as in the case of a semiconductor device 102d according to Modification 9 (see FIG. 24).

(7) In the above-mentioned Embodiment 3, the shape of the recessed portion 134 is formed in a tapered shape where the first semiconductor region 120 side is narrow as viewed in a plan view and a gradient of the tapered shape is 45°. However, the present invention is not limited to such a configuration. The gradient of the tapered shape may not be 45°.

(8) Provided that a withstand voltage of the second side portion is lower than a withstand voltage of the second corner portion, even in the case where the condition that the relationship of FP1>FP2 is established at least at a portion of the field plate is satisfied, a region such as the second region described in the above-mentioned Embodiment 6 may also exist.

Figure 25:
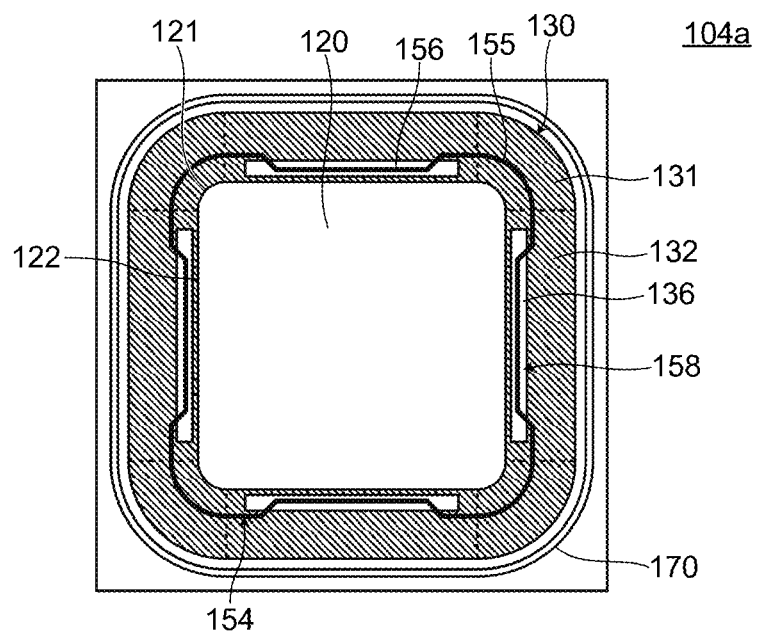
FIG. 25 is a plan view of a semiconductor device 104a according to Modification 10.
Figure 26:
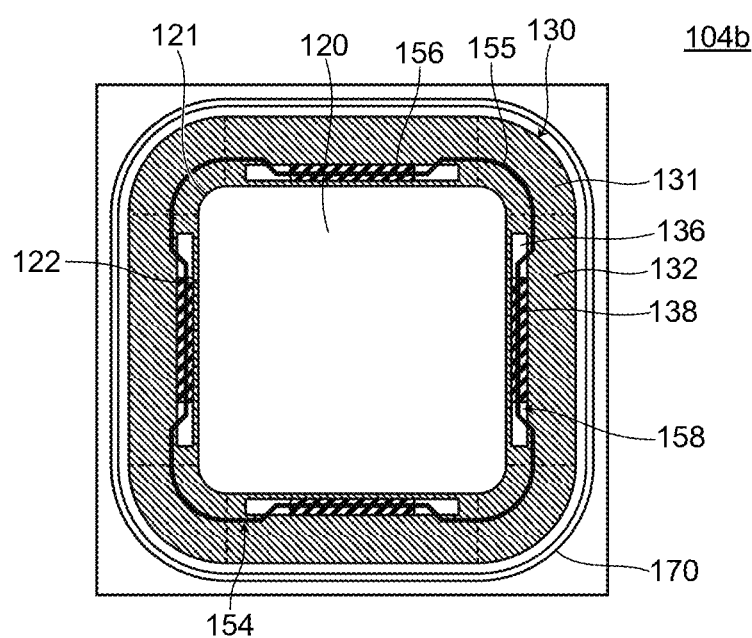
FIG. 26 is a plan view of a semiconductor device 104b according to Modification 11.
Figure 27A:
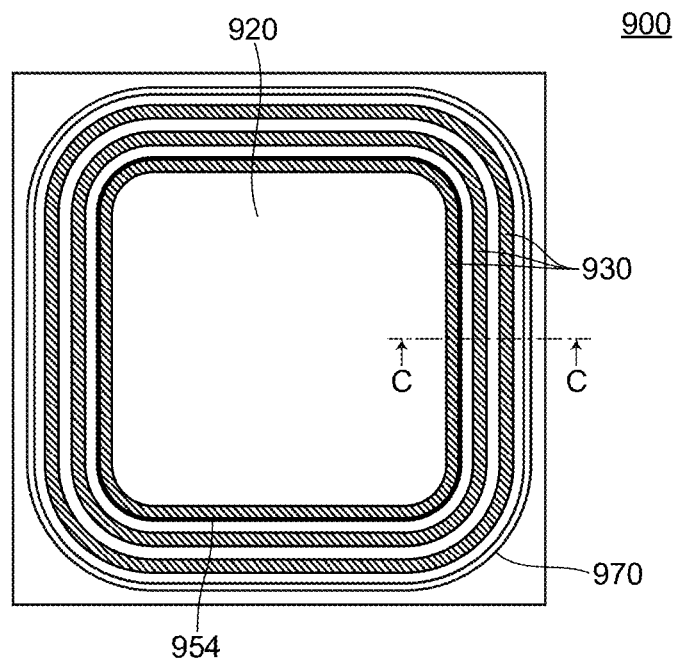
FIG. 27A and FIG. 27B are views for describing a conventional semiconductor device 900.
Figure 27B:
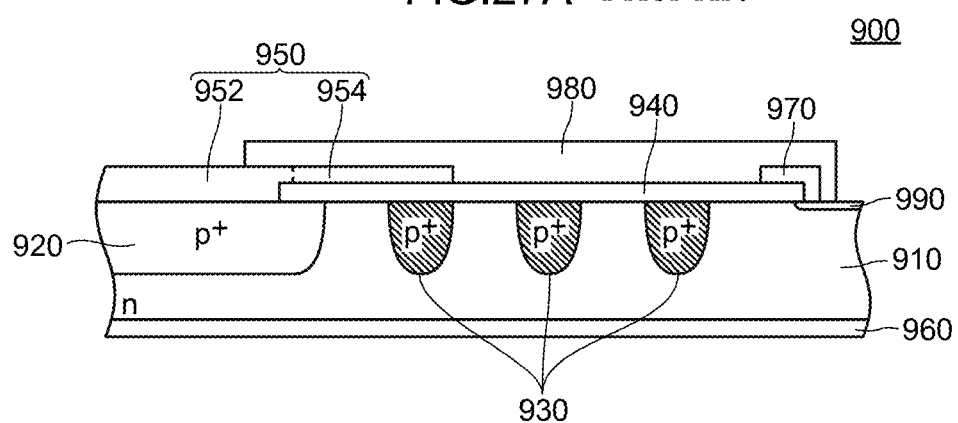

(9) Even in the case where the condition that a relationship of FP1>FP2 is established at least at a portion of the field plate 154 is satisfied as in the case of the semiconductor device 104 according to the above-mentioned Embodiment 5, as in the case of a semiconductor device 104a according to Modification 10 (see FIG. 25) and a semiconductor device 104b according to Modification 11 (see FIG. 26), a first region (see symbol 136 in FIG. 25 and FIG. 26) may exist and, further, a high resistance region (see symbol 138 in FIG. 26) may be formed. Further, the above-mentioned semiconductor device may further have a recessed portion indented toward the inside as viewed in a plan view at an outer edge of the second side portion.

(10) In the above-mentioned respective embodiments, an n type is set as a first conductive type and a p type is set as a second conductive type. However, the present invention is not limited to such a configuration. A p type may be set as the first conductive type, and an n type may be set as the second conductive type.

The invention claimed is:

1. A semiconductor device comprising:
a semiconductor base substrate of a first conductive type;
a first semiconductor region of a second conductive type formed on a surface of a first main surface of the semiconductor base substrate, the first semiconductor region having a plurality of first corner portions and a plurality of first side portions;
a surface semiconductor region of the second conductive type formed on the surface of the first main surface so as to include a region where the surface semiconductor region overlaps with the first semiconductor region as viewed in a plan view, the surface semiconductor region having a plurality of second corner portions and a plurality of second side portions formed so as to surround the first semiconductor region as viewed in the plan view, and the surface semiconductor region having dopant concentration lower than a dopant concentration of the first semiconductor region;
an insulation film formed on the surface of the first main surface in a range from a region where the first semiconductor region is formed to a region outside the surface semiconductor region as viewed in the plan view;
a first semiconductor region side electrode formed in a region overlapping with the first semiconductor region as viewed in the plan view; and
a field plate formed in a region overlapping with the surface semiconductor region as viewed in the plan view by way of the insulation film, the field plate having a plurality of field plate corner portions and a plurality of field plate side portions, wherein
a total length of the surface semiconductor region from an outer edge of the first semiconductor region to an outer edge of the surface semiconductor region as viewed in the plan view of the second corner portion as L1, and a total length of the surface semiconductor region from the outer edge of the first semiconductor region to the outer edge of the surface semiconductor region as viewed in the plan view of the second side portion as L2, and
a length from the outer edge of the first semiconductor region side electrode to the outer edge of the field plate as viewed in the plan view of the field plate corner portion as FP1, and a length from the outer edge of the first semiconductor region side electrode to the outer edge of the field plate as viewed in the plan view of the field plate side portion as FP2,
at least one of a condition (1) that a relationship of L1>L2 is established at least at a portion of the surface semiconductor region and a condition (2) that a relationship of FP1>FP2 is established at least at a portion of the field plate is satisfied, and a withstand voltage of the second side portion is lower than a withstand voltage of the second corner portion.

2. The semiconductor device according to claim 1, wherein the condition (1) that the relationship of L1>L2 is established at least at the portion of the surface semiconductor region is satisfied, and
a recessed portion indented toward an inside as viewed in the plan view is formed on the outer edge of the second side portion.

3. The semiconductor device according to claim 2, wherein the surface semiconductor region is not formed at least in a first region disposed at a position remote from an outer edge of the second side portion as viewed in the plan view.

4. The semiconductor device according to claim 3, wherein the recessed portion is formed such that a portion of a bottom of the recessed portion forms a straight line extending in an x direction which is a direction directed from one said second corner portion to the other said second corner portion between the second corner portions disposed adjacently to each other as viewed in the plan view, a shape of the recessed portion is a tapered shape where the first semiconductor region side is narrow as viewed in the plan view, and a shape of the first region is a strip shape extending in a direction along the x direction as viewed in the plan view.

5. The semiconductor device according to claim 1, wherein the condition (1) that the relationship of L1>L2 is established at least at the portion of the surface semiconductor region is satisfied, and the surface semiconductor region is not formed at least in a first region disposed at a position remote from an outer edge of the second side portion as viewed in the plan view.

6. The semiconductor device according to claim 3, wherein a high resistance region having a larger electric resistance than the surface semiconductor region is formed at least at a portion of the first region.

7. The semiconductor device according to claim 3, wherein the first region is disposed at a position where the first region overlaps with the field plate as viewed in the plan view.

8. The semiconductor device according to claim 3, wherein the surface semiconductor region is not formed in a second region disposed at a position remote from the outer edge of the second corner portion as viewed in the plan view.

9. The semiconductor device according to claim 8, wherein the first region and the second region are formed continuously with each other.

10. The semiconductor device according to claim 1, wherein the condition (2) that the relationship of FP1>FP2 is established at least at the portion of the field plate is satisfied.

11. The semiconductor device according to claim 10, wherein the condition (1) that the relationship of L1>L2 is established at least at the portion of the surface semiconductor region is satisfied, and the surface semiconductor region is not formed at least in a first region disposed at a position remote from an outer edge of the second side portion as viewed in the plan view.

12. The semiconductor device according to claim 11, wherein a high resistance region having a larger electric resistance than the surface semiconductor region is formed at least at a portion of the first region.

* * * * *